US012600100B2

(12) United States Patent
Kasahara

(10) Patent No.: US 12,600,100 B2
(45) Date of Patent: Apr. 14, 2026

(54) POLARIZING PLATE, CIRCULARLY POLARIZING PLATE, AND METHOD FOR PRODUCING POLARIZING PLATE

(71) Applicant: FUJIFILM Corporation, Tokyo (JP)

(72) Inventor: Takehiro Kasahara, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 671 days.

(21) Appl. No.: 17/879,024

(22) Filed: Aug. 2, 2022

(65) Prior Publication Data

US 2022/0397713 A1 Dec. 15, 2022

Related U.S. Application Data

(63) Continuation of application No. PCT/JP2020/047900, filed on Dec. 22, 2020.

(30) Foreign Application Priority Data

Feb. 3, 2020 (JP) ................................ 2020-016036

(51) Int. Cl.
*G02B 5/30* (2006.01)
*B29D 11/00* (2006.01)
*H10K 59/80* (2023.01)

(52) U.S. Cl.
CPC ...... *B29D 11/00644* (2013.01); *G02B 5/3016* (2013.01); *G02B 5/3033* (2013.01); *H10K 59/8793* (2023.02); *H10K 59/8791* (2023.02)

(58) Field of Classification Search
CPC ...... G02B 5/30; G02B 5/3008; G02B 5/3016; G02B 5/3025; G02B 5/3083
See application file for complete search history.

(56) References Cited

U.S. PATENT DOCUMENTS

2002/0187575 A1 12/2002 Maruyama et al.
2015/0160390 A1* 6/2015 Goyal .................. G06F 1/1605 359/483.01

(Continued)

FOREIGN PATENT DOCUMENTS

JP 2002-329576 A 11/2002
JP 2006-284832 A 10/2006

(Continued)

OTHER PUBLICATIONS

English machine translation of WO-2011135799-A1 (Year: 2011).*

(Continued)

*Primary Examiner* — Nicholas R. Pasko
(74) *Attorney, Agent, or Firm* — Birch, Stewart, Kolasch & Birch, LLP

(57) ABSTRACT

An object is to provide a polarizing plate, a circularly polarizing plate, and a method for producing a polarizing plate, each of which can accomplish both of the antireflection effect for external light and an improvement in the utilization efficiency of light emitted by a light emitting element, in a case of being used in a self-luminous display device using an inorganic EL element, an organic EL element, or the like. The polarizing plate is a polarizing plate having an alignment film and a polarizer layer including a dichroic coloring agent, in which the polarizing plate has a plurality of through-holes that penetrate the alignment film and the polarizer layer, and the light transmittance in a portion where the alignment film and the polarizer layer are present is 80% or less.

14 Claims, 4 Drawing Sheets

(56) References Cited

U.S. PATENT DOCUMENTS

| | | | | |
|---|---|---|---|---|
| 2016/0147080 | A1* | 5/2016 | Son | G02B 5/008 427/163.1 |
| 2016/0313480 | A1 | 10/2016 | Lee et al. | |
| 2017/0129197 | A1* | 5/2017 | Yaegashi | B29C 55/023 |
| 2017/0137671 | A1* | 5/2017 | Ogomi | C09J 7/20 |
| 2017/0261658 | A1* | 9/2017 | Kim | G02B 5/0278 |
| 2018/0348416 | A1* | 12/2018 | Lee | G02F 1/13 |
| 2020/0411609 | A1 | 12/2020 | Yonemoto | |
| 2021/0026195 | A1 | 1/2021 | Kuwayama et al. | |

FOREIGN PATENT DOCUMENTS

| | | | | |
|---|---|---|---|---|
| JP | 2009163085 | A * | 7/2009 | |
| JP | 2010-42623 | A | 2/2010 | |
| JP | 2015-31823 | A | 2/2015 | |
| JP | 2016-541022 | A | 12/2016 | |
| JP | 2018-31954 | A | 3/2018 | |
| JP | 2019-169470 | A | 10/2019 | |
| WO | WO-2011135799 | A1 * | 11/2011 | H10K 59/8791 |
| WO | WO 2019/176918 | A1 | 9/2019 | |
| WO | WO 2019/203192 | A1 | 10/2019 | |

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2020/047900, dated Aug. 18, 2022, with an English translation.

International Search Report (Form PCT/ISA/210) for International Application No. PCT/JP2020/047900, dated Mar. 9, 2021, with an English translation.

Japanese Office Action for corresponding Japanese Application No. 2021-575648, dated Jan. 9, 2024, with English translation.

Japanese Notice of Reasons for Refusal for corresponding Japanese Application No. 2021-575648, dated Aug. 29, 2023, with an English translation.

Japanese Decision of Dismissal of Amendment for corresponding Japanese Application No. 2021-575648, dated May 7, 2024, with English translation.

Japanese Decision of Refusal for corresponding Japanese Application No. 2021-575648, dated May 7, 2024, with English translation.

* cited by examiner

POLARIZING PLATE, CIRCULARLY POLARIZING PLATE, AND METHOD FOR PRODUCING POLARIZING PLATE

CROSS-REFERENCE TO RELATED APPLICATIONS

This application is a Continuation of PCT International Application No. PCT/JP2020/047900 filed on Dec. 22, 2020, which claims priority under 35 U.S.C. § 119(a) to Japanese Patent Application No. 2020-016036 filed on Feb. 3, 2020. Each of the above applications is hereby expressly incorporated by reference, in its entirety, into the present application.

BACKGROUND OF THE INVENTION

1. Field of the Invention

The present invention relates to a polarizing plate, a circularly polarizing plate, and a method for producing a circularly polarizing plate.

2. Description of the Related Art

In recent years, development of display devices employing self-luminous type light emitting elements such as organic electroluminescence (organic EL) and inorganic EL (inorganic light emitting diode (inorganic LED)) as a display device that replaces a liquid crystal display device has been in progress.

An image display device reflects external light, especially in a bright environment, and thus deteriorates a contrast. Therefore, a self-luminous type display device using a light emitting element, such as an organic EL display device and an inorganic EL display device, is provided with a circularly polarizing plate consisting of a polarizer and a λ/4 plate on a surface thereof as an antireflection film. As a result, it is possible to prevent the reflection of external light, thereby enabling image display with a high contrast.

However, on the other hand, an antireflection film consisting of a polarizer and a λ/4 plate has a problem in that it also absorbs light emitted by a light emitting element, and thus causes the brightness to be lowered.

On the other hand, WO2019/176918A describes an electroluminescence display device having an electroluminescence substrate having a plurality of light emitting elements using electroluminescence, a λ/4 plate, and a polarizing plate including a polarizer layer in this order, in which the polarizer layer has a region A having a degree of polarization of less than 80% and a region B having a degree of polarization of 80% or more, and further, the position of the region A of the polarizer layer and the position of the light emitting element of the electroluminescence substrate correspond to each other.

In WO2019/176918A, by making the position of the light emitting element of the electroluminescence substrate correspond to the region A having a degree of polarization of less than 80%, the absorption of light emitted by the light emitting element is suppressed, and the utilization efficiency of light is increased.

SUMMARY OF THE INVENTION

In WO2019/176918A, a coated type polarizer layer is used, an exposed portion and an unexposed portion are formed by performing exposure via a mask upon ultraviolet (UV) exposure at the time of curing the polarizer layer, and then the unexposed portion is removed with a solvent such as ethanol to form a region A having a degree of polarization of less than 80%.

However, in a polarizing plate manufactured by such a method, there were cases where in particular, a dichroic coloring agent having a low solubility in a solvent such as ethanol remained, among the polarizer layer components once dissolved, and the degree of polarization of the region A could not be sufficiently lowered. As a result, light emitted by the light emitting element was absorbed, and thus, the utilization efficiency of light could not be sufficiently increased.

In addition, in a case where the unexposed portion is removed by using a solvent with a high solubility in order to completely remove the unexposed portion, there is a possibility that a part of the exposed portion could also be dissolved. In that case, since the degree of polarization of the polarizer layer is lowered, there is a possibility that the antireflection effect for external light could be lowered.

In view of solving such a problem of the related art, an object of the present invention is to provide a polarizing plate, a circularly polarizing plate, and a method for producing a polarizing plate, each of which can accomplish both of the antireflection effect for external light and an improvement in the utilization efficiency of light emitted by a light emitting element in a case where they are each used in a self-luminous type display device using an inorganic EL element, an organic EL element, or the like.

In order to accomplish the object, the present invention has the following configurations.

[1] A polarizing plate comprising:

an alignment film; and a polarizer layer including a dichroic coloring agent, in which the polarizing plate has a plurality of through-holes that penetrate the alignment film and the polarizer layer.

[2] The polarizing plate as described in [1], in which a film thickness of the polarizer layer is 5 μm or less.

[3] The polarizing plate as described in [1] or [2], in which an opening ratio of the through-holes is 50% or less.

[4] The polarizing plate as described in any one of [1] to [3], in which an average opening diameter of the through-holes is 10 μm to 3 mm.

[5] The polarizing plate as described in any one of [1] to [4], in which a number density of the through-holes is 3 to 2,500/$in^2$.

[6] The polarizing plate as described in any one of [1] to [5], in which the dichroic coloring agent is water-insoluble.

[7] A circularly polarizing plate comprising:

the polarizing plate as described in any one of [1] to [6]; and a λ/4 plate.

[8] A method for producing a polarizing plate having a plurality of through-holes that penetrate an alignment film and a polarizer layer, the method comprising:

an alignment film forming step of forming an alignment film having a plurality of through-parts, on a transfer support;

a polarizer layer forming step of forming a layer consisting of a composition to be a polarizer layer on the alignment film and the transfer support in the through-parts; and a peeling step of peeling the transfer support and the layer consisting of the composition to be the polarizer layer on the transfer support.

[9] A method for producing a polarizing plate, the method comprising forming a plurality of through-holes by carrying out punching of a laminate having an alignment film and a polarizer layer.

According to the present invention, it is possible to provide a polarizing plate, a circularly polarizing plate, and a method for producing a polarizing plate, each of which can accomplish both of the antireflection effect for external light and an improvement in the utilization efficiency of light emitted by a light emitting element, in a case where they are each used in a self-luminous display device using an inorganic EL element, an organic EL element, or the like.

DESCRIPTION OF THE PREFERRED EMBODIMENTS

Figure 1:
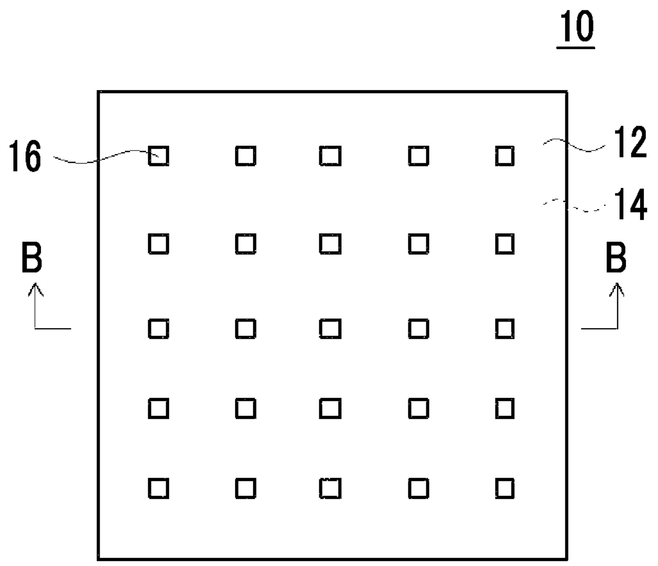
FIG. 1 is a plan view schematically illustrating an example of a polarizing plate of an embodiment of the present invention.

Hereinafter, provision of the polarizing plate, the circularly polarizing plate, and the method for producing a polarizing plate of the embodiments of the present invention will be described in detail, based on suitable Examples shown in the accompanying drawings.

Descriptions of the constituent requirements described below may be made based on representative embodiments of the present invention, but the present invention is not limited to the following embodiments.

Furthermore, in the present specification, a numerical range expressed using "to" means a range which includes the preceding and succeeding numerical values of "to" as a lower limit value and an upper limit value, respectively.

In the present invention, visible light is light having a wavelength visible to the human eye among electromagnetic waves, and indicates light in the wavelength range of 380 to 780 nm. Invisible light is light in the wavelength range of less than 380 nm and a wavelength range of more than 780 nm.

In addition, although not limited to this, among the visible light, the light in the wavelength range of 420 to 490 nm is blue light, the light in the wavelength range of 495 to 570 nm is green light, and the light in the wavelength range of 620 to 750 nm is red light.

In the present invention, the degree of polarization of the polarizing plate may be determined by determining an MD transmittance and a TD transmittance of the polarizing plate in the wavelength range of 380 to 780 nm, calculating a degree (%) of polarization at each wavelength by Equation (1), and correcting the visual sensitivity with a 2-degree visual field (C light source) of JIS Z 8701. Furthermore, the degree of polarization of the polarizing plate is also referred to as a visual sensitivity correction polarization degree.

$$\text{Degree (\%) of polarization}=[(MD-TD)/(MD+TD)]^{1/2}\times 100 \qquad \text{Equation (1)}$$

In addition, a single-body transmittance of each region of the polarizing plate may be determined by determining an MD transmittance and a TD transmittance of the polarizing plate in the wavelength range of 380 to 780 nm, calculating a single-body transmittance at each wavelength by Equation (2), and correcting the visual sensitivity with the 2-degree visual field (C light source) of JIS Z 8701. Incidentally, the single-body transmittance of each region of the polarizing plate is also referred to as a visual sensitivity correction single-body transmittance.

$$\text{Single-body transmittance (\%)}=(MD+TD)/2 \qquad \text{Equation (2)}$$

Furthermore, the "MD transmittance" is a transmittance in a case where the direction of polarized incidence light on a polarizing plate sample and the transmission axis of the polarizing plate sample are parallel to each other, and in Equations (1) and (2), the MD transmittance is represented by "MD". In addition, the "TD transmittance" is a transmittance in a case where the direction of polarized incidence light on a polarizing plate sample and the transmission axis of the polarizing plate sample are orthogonal to each other, and in Equations (1) and (2), the TD transmittance is represented by "TD".

[Polarizing Plate]

The polarizing plate of the embodiment of the present invention is a polarizing plate having an alignment film and a polarizer layer including a dichroic coloring agent, in which the polarizing plate has a plurality of through-holes that penetrate the alignment film and the polarizer layer.

Figure 2:
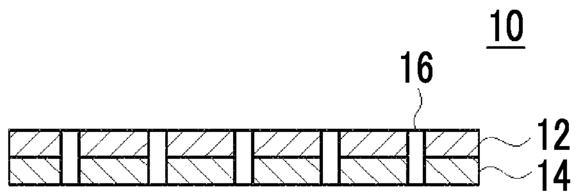
FIG. 2 is a cross-sectional view taken along a line B-B of FIG. 1.

FIG. 1 shows a plan view schematically illustrating an example of the polarizing plate of the embodiment of the present invention. In other words, FIG. 1 is a view seen from a normal direction of the main surface of the polarizing plate. FIG. 2 shows a cross-sectional view taken along a line B-B of FIG. 1.

A polarizing plate 10 shown in FIGS. 1 and 2 has an alignment film 14 and a polarizer layer 12. The polarizing plate 10 has a plurality of through-holes 16 that penetrate the alignment film 14 and the polarizer layer 12.

In the polarizing plate 10, the portion where the alignment film 14 and the polarizer layer 12 are present acts as a linear polarizer. Therefore, the light transmittance of the portion where the alignment film 14 and the polarizer layer 12 are present is lower than that of the through-hole 16 portion, and is, for example, 80% or less.

In the illustrated example, the shape of the opening portion of the through-hole 16 is rectangular. In addition, the through-holes 16 are regularly arranged in the plane direction of the main surface of the polarizing plate 10. In the example shown in FIG. 1, the through-holes 16 are arranged at predetermined intervals in the vertical direction and the horizontal direction in FIG. 1. Furthermore, the main surface is the maximum area surface of a sheet-like object (a plate-like object, a film, and the like).

The polarizing plate 10 can be used as an antireflection film in a display device. At that time, the polarizing plate 10 is arranged so that the position of the through-hole 16 and the position of the light emitting element of the display device correspond to each other. That is, in the plane direction, the polarizing plate 10 is arranged so that the position of the through-hole 16 and the position of the light emitting element of the display device overlap. Therefore, since the reflection of external light incident on the polarizing plate 10 is prevented by the polarizer layer, a reduction in the contrast due to the reflection of the external light can be suppressed. In addition, since the light emitted by the light emitting element is incident on the through-hole 16, many light components can be transmitted without being absorbed by the polarizer layer 12 and the alignment film 14. As a result, a display device that can achieve both of the antireflection effect for external light and an improvement of utilization efficiency of light emitted by the light emitting element can be realized.

Here, the size, the shape, the arrangement position (arrangement pattern), the number density, and the like of the through-holes 16 may be appropriately set according to the size, the shape, the arrangement position, the number density, and the like of the light emitting element of the display device in which the polarizing plate 10 is used.

From the viewpoint of transmitting the light emitted by the light emitting element, the size of the through-hole is preferably larger than that of the light emitting element. In addition, it is preferable that the through-hole has such a size and shape that includes the light emitting element in the plane direction. Moreover, it is preferable that the center of the through-hole coincides with the center (optical axis) of the light emitting element coincide in a case of being viewed from the normal direction of the main surface. Further, it is particularly preferable that the center of the through-hole coincides with the center of the light emitting element, and the through-hole includes the light emitting element.

An average opening diameter of the through-holes is preferably 10 μm to 3 mm, more preferably 10 μm to 1 mm, and still more preferably 10 μm to 100 μm.

Furthermore, as for the average opening diameter of the through-holes, a surface of the polarizing plate is photographed at a magnification of 100 times using a high-resolution scanning electron microscope (SEM), and in the obtained SEM photograph, at least 20 through-holes connected in a ring shape are extracted, opening diameters thereof are read, and an average value thereof is calculated as the average opening diameter.

In addition, the opening diameter was taken as a diameter equivalent to a circle. That is, since the shape of the opening of the through-hole is not limited to a substantially circular shape, in a case where the shape of the opening is non-circular, the diameter equivalent to a circle is obtained from the area of the opening.

The opening shape of the through-hole may be appropriately set according to the shape of the light emitting element and the like. The opening shape of the through-hole can be various shapes such as a square shape, a rectangular shape, a circular shape, an elliptical shape, a polygonal shape, and an indefinite shape.

From the viewpoint of achieving both of the antireflection effect for external light and the utilization efficiency of light emitted by the light emitting element, an average opening ratio of the through-holes is preferably 50% or less, more preferably 30% to 0.1%, and still more preferably 10% to 0.1%.

Furthermore, as for the average opening ratio of the through-holes, a surface of the polarizing plate is photographed directly from the above at a magnification of 100 times using a high-resolution scanning electron microscope (SEM), and in a visual field (five locations) of 30 mm×30 mm in the obtained SEM photograph, the through-hole portions and the non-through-hole portions are observed after binarization with image analysis software and the like, ratios (opening area/geometric area) of a total opening area of the through-holes to an area (geometric area) of the visual field are calculated, and an average value thereof in each visual field (five locations) is calculated as the average opening ratio.

A number density of the through-holes may be appropriately set according to the shape of the light emitting element and the like. The number density of the through-holes is preferably 3 to 2,500/$in^2$, more preferably 3 to 100/$in^2$, and still more preferably 3 to 10/$in^2$.

Furthermore, as for the number density of the through-holes, a surface of the polarizing plate is photographed at a magnification of 100 times using a high-resolution scanning electron microscope (SEM), and in a visual field (five locations) in 1 mm×1 mm in the range of 10 cm×10 cm in the obtained SEM photograph, the number density (number of through-holes/geometric area) is calculated from the number of the through-holes and the area (geometric area) of the visual field, and an average value thereof at each visual field (five locations) is calculated as the number density.

In the present invention, a thickness of the polarizing plate 10 is not limited, and may be appropriately set according to the configuration of the polarizing plate, the material that forms the polarizing plate, and the like. A thickness of the polarizing plate 10 is preferably 1 to 100 μm, more preferably 1 to 30 μm, and still more preferably 1 to 10 μm.

The degree of polarization in a region other than the through-holes of the polarizing plate 10 (polarizer layer 12) (hereinafter also referred to as "the degree of polarization of the polarizing plate") is preferably 80% or more. In a case where the degree of polarization of the polarizing plate 10 is less than 80%, a sufficient antireflection effect for external light cannot be obtained. The degree of polarization of the polarizing plate 10 is preferably 90% or more, and more preferably 95% or more.

Figure 3:
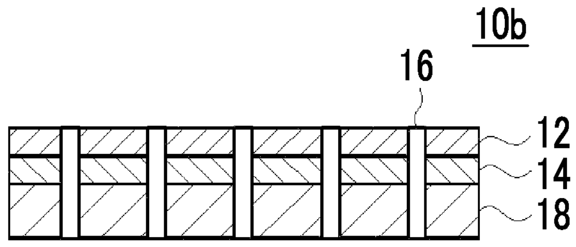
FIG. 3 is a cross-sectional view schematically illustrating another example of the polarizing plate of the embodiment of the present invention.

Here, the examples shown in FIGS. 1 and 2 have a configuration in which the polarizing plate has only an alignment film and a polarizer layer, but the present invention is not limited to this and may also have a configuration in which the polarizing plate further has a support 18, as in a polarizing plate 10*b* shown in FIG. 3. In the case of the configuration in which the polarizing plate has a support, a configuration in which a through-hole is not formed in the support, and the through-hole is formed only in the alignment film and the polarizer layer may be adopted, and a configuration in which the through-holes 16 are penetrated into the alignment film 14, the polarizer layer 12, and the support 18 as in the example shown in FIG. 3 may also be adopted.

Figure 4:
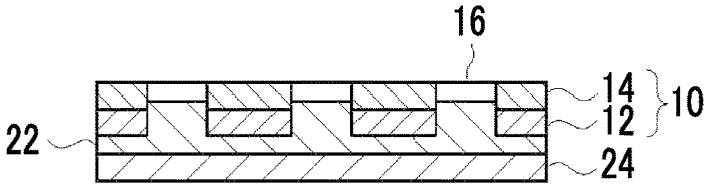
FIG. 4 is a cross-sectional view schematically illustrating still another example of the polarizing plate of the embodiment of the present invention.

In addition, a configuration in which a protective film 24 is laminated on the polarizer layer 12 side via a pressure-sensitive adhesive layer 22 as in the example shown in FIG. 4 may be adopted. The protective film 24 may not have a through-hole, as shown in FIG. 4. In addition, the pressure-sensitive adhesive layer 22 may be filled in at least a part of the through-holes 16 as shown in FIG. 4.

Moreover, the polarizing plate may be laminated with various functional layers used in an optical film such as an overcoat layer and a gas barrier layer.

[Circularly Polarizing Plate]

The circularly polarizing plate of the embodiment of the present invention is a circularly polarizing plate having:

the above-mentioned polarizing plate, and a λ/4 plate.

Figure 5:
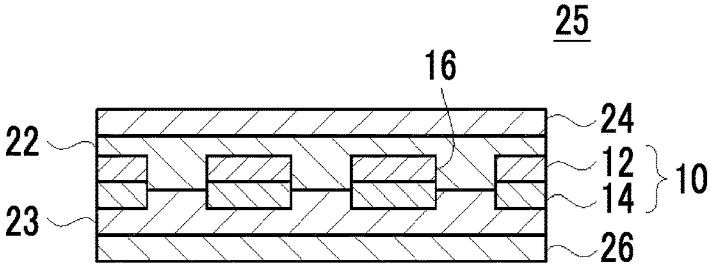
FIG. 5 is a cross-sectional view schematically illustrating an example of a circularly polarizing plate of an embodiment of the present invention.

FIG. 5 shows a cross-sectional view schematically showing an example of the circularly polarizing plate of the embodiment of the present invention.

A circularly polarizing plate 25 shown in FIG. 5 has a λ/4 plate 26, a pressure-sensitive adhesive layer 23, a polarizing plate 10 having an alignment film 14 and a polarizer layer 12, an pressure-sensitive adhesive layer 22, and a protective film 24.

The polarizing plate 10 is the polarizing plate of the embodiment of the present invention, which has a plurality of through-holes 16 that penetrate the alignment film 14 and the polarizer layer 12.

The circularly polarizing plate 25 shown in FIG. 5 has a configuration in which the λ/4 plate 26 is laminated on the alignment film 14 side of the polarizing plate 10 via the pressure-sensitive adhesive layer 23, and the protective film 24 is laminated on the polarizer layer 12 side of the polarizing plate 10 via the pressure-sensitive adhesive layer 22.

Figure 6:
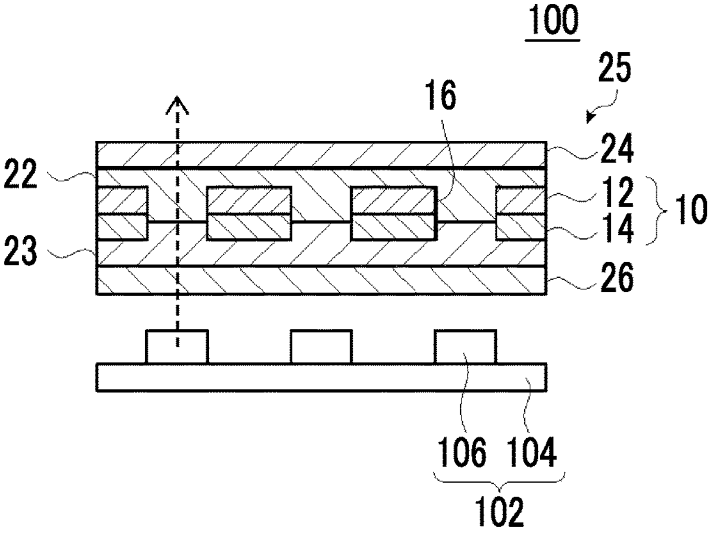
FIG. 6 is a cross-sectional view schematically illustrating an example of a display device using the polarizing plate of the embodiment of the present invention.

FIG. 6 schematically illustrates a display device 100 having such a circularly polarizing plate 25.

The display device shown in FIG. 6 has the circularly polarizing plate 25, and a display element 102 having an element substrate 104 and a plurality of light emitting elements 106 arranged on the element substrate 104.

The circularly polarizing plate 25 is used as an antireflection film in the display device 100. That is, in a case where external light is incident on the polarizing plate, the linearly polarized light component in the same direction as the transmission axis is transmitted, but the linearly polarized light component orthogonal to the transmission axis is absorbed by the polarizer, depending on the direction of the transmission axis of the polarizing plate 10. The linearly polarized light transmitted through the polarizing plate 10 is converted into circularly polarized light by the λ/4 plate 26 and then reflected by the element substrate 104 or the like of the display device 100, and thus, the turning direction of the circularly polarized light is reversed. The circularly polarized light reflected by the element substrate 104 is re-incident on the λ/4 plate 26 and converted into linearly polarized light. Here, the circularly polarized light that is re-incident on the λ/4 plate 26 has a turning direction opposite to that of the previously converted circularly polarized light. Therefore, the linearly polarized light that is re-incident on the λ/4 plate 26 and converted serves as a linearly polarized light in the direction orthogonal to the transmission axis of the polarizing plate 10. Therefore, this linearly polarized light is absorbed by the polarizer. As a result, the reflection of external light can be prevented.

Here, the polarizing plate 10 has the through-holes 16 as described above. Since the light emitted by the light emitting element 106 is incident on the through-holes 16 by arranging the through-holes 16 of the polarizing plate 10 so as to correspond to the position of the light emitting element 106 of the display device 100, many light components can be transmitted without being absorbed by the polarizer layer 12 and the alignment film 14. As a result, a display device that can achieve both of the antireflection effect for external light and an improvement of utilization efficiency of light emitted by the light emitting element can be realized.

Here, in the present invention, the total of the thickness of the above-mentioned λ/4 plate 26 and the thickness of the polarizing plate 10 is preferably 20 μm or less.

By setting the total thickness of the λ/4 plate 26 and the polarizing plate 10 to 20 μm or less, the display element and the polarizer layer 12 are brought close to each other, and thus, an expected angle from the light emitting element to the through-hole can be increased to improve the utilization efficiency of light emitted by the light emitting element.

As described above, the polarizing plate 10 of the embodiment of the present invention is arranged so that the position of the through-hole 16 and the position of the light emitting element 106 in the display element 102 correspond to each other.

In a case where an area ratio of the through-holes in the polarizing plate 10 is defined as SA [%] and an area ratio of the light emitting element 106 in the display element 102 is defined as SP [%], the following relationship is preferably satisfied:

$$0.5 \leq SA/SP \text{ and } SA < 50\%.$$

In a case where the polarizing plate 10 and the display element 102 satisfy "0.5≤SA/SP" and "SA<50%", both of the improvement of the utilization efficiency of light emitted by the light emitting element and the antireflection function for external light can be more suitably achieved.

Furthermore, in the present invention, 0.8≤SA/SP is more preferably satisfied, and 1.0≤SA/SP is still more preferably satisfied.

In addition, SA<30% is more preferably satisfied, and SA<20% is still more preferably satisfied.

That is, it is more preferable that SA/SP and SA satisfy this range.

In the display device 100, it is preferable that a distance L between the light emitting element 106 of the display element 102 and the polarizer layer 12 is smaller than a pitch p of the light emitting element 106 in the display element 102. Incidentally, the pitch p of the light emitting element in the display element 102 is a distance between the centers of the light emitting elements.

Since the display device 100 is suitably visible even from an oblique visual field, the emitted light that is emitted by the light emitting element 106 of the display element 102 includes light emitted obliquely with respect to the normal of the emitting surface. Therefore, by setting the distance L between the light emitting element of the display element 102 and the polarizer layer 12 to be smaller than the pitch p of the light emitting element, the light emitted by the light emitting element 106 can be incident on the through-holes even in a case here the area of the through-hole is reduced. As a result, both of the improvement in the utilization efficiency of light emitted by the light emitting element 106 of the display element 102 and the antireflection function can be more suitably achieved.

Furthermore, the distance L between the light emitting element 106 and the polarizer layer 12 is more preferably 80% or less, still more preferably 50% or less, and even still more preferably 20% or less of the pitch p of the light emitting element.

In the example shown in FIG. 6, the element substrate 104 and the light emitting elements 106 formed in plural number on the element substrate 104 are shown as the constituent elements of the display element 102, but the display element 102 may have another layer. For example, the display element 102 may have a configuration in which an insulating film, a transparent electrode layer (thin film transistor (TFT)), an insulating film, a light emitting element 106, and an insulating film are sequentially laminated on the element substrate 104. In addition, it may have a passivation film that protects the light emitting element 106.

Hereinafter, each component will be described in detail.

[Polarizer Layer]

The polarizer layer 12 can be formed of various known materials used for a polarizer.

Here, in the present invention, the polarizer layer 12 is formed by using a material that exhibits polarization performance by application without including a stretching treatment from the viewpoint of pattern formation which will be described later. More specifically, the polarizer layer 12 preferably includes a liquid crystalline compound and a coloring agent. Furthermore, as the coloring agent, a dichroic coloring agent compound is suitably exemplified. In addition, it is preferable to use a water-insoluble dichroic coloring agent as the dichroic coloring agent.

Incidentally, the dichroic coloring agent is water-insoluble in a case where it has a solubility in water at 25° C. is 0.1% or less.

<Dichroic Coloring Agent Compound>

In the present invention, various known compounds can be used as the dichroic coloring agent compound contained in the polarizer layer 12, but a dichroic coloring agent compound represented by Formula (1) (hereinafter also referred to as a "specific dichroic coloring agent compound") is suitably exemplified.

$$L^1—A^1—N{=}N\left(A^2—N{=}N\right)_m A^3—L^2 \quad (1)$$

Here, in Formula (1), $A^1$, $A^2$, and $A^3$ each independently represent a divalent aromatic group which may have a substituent.

Furthermore, in Formula (1), $L^1$ and $L^2$ each independently represent a substituent.

In addition, in Formula (1), m represents an integer of 1 to 4, and in a case where m is an integer of 2 to 4, a plurality of $A^2$'s may be the same as or different from each other. Further, m is preferably 1 or 2.

In Formula (1), the "divalent aromatic group which may have a substituent", represented by each of $A^1$, $A^2$, and $A^3$ will be described.

Examples of the substituent include the substituent group G described in paragraphs [0237] to [0240] of JP2011-237513A, and among those, the halogen atom, the alkyl group, the alkoxy group, the alkoxycarbonyl group, the aryloxycarbonyl group, and the like are suitably mentioned. Examples of the alkoxycarbonyl group include methoxycarbonyl and ethoxycarbonyl. Examples of the aryloxycarbonyl group include phenoxycarbonyl, 4-methylphenoxycarbonyl, and 4-methoxyphenylcarbonyl. Among those, the alkyl group is more suitably mentioned, and an alkyl group having 1 to 5 carbon atoms is still more suitably mentioned.

On the other hand, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among those, the phenylene group is preferable.

Furthermore, as the above-mentioned divalent aromatic heterocyclic group, a monocyclic or bicyclic heterocycle-derived group is preferable. Examples of atoms other than carbon, constituting the aromatic heterocyclic group, include a nitrogen atom, a sulfur atom, and an oxygen atom. In a case where the aromatic heterocyclic group has a plurality of atoms constituting a ring, which are other than carbon, these atoms may be the same as or different from each other. Specific examples of the aromatic heterocyclic group include a pyridylene group (pyridine-diyl group), a quinolylene group (quinoline-diyl group), an isoquinolylene group (isoquinoline-diyl group), a benzothiadiazole-diyl group, a phthalimide-diyl group, and a thienothiazole-diyl group (hereinafter abbreviated as a "thienothiazole group").

Among such divalent aromatic groups, the divalent aromatic hydrocarbon group is preferable.

Here, it is preferable that any one of $A^1$, $A^2$, and $A^3$ is a divalent thienothiazole group which may have a substituent. Furthermore, specific examples of the substituent of the divalent thienothiazole group include the same ones as those of the substituent in the "divalent aromatic group which may have a substituent" as mentioned above, and preferred aspects thereof are also the same.

In addition, it is more preferable that $A^2$ out of $A^1$, $A^2$, and $A^3$ is a divalent thienothiazole group. In this case, $A^1$ and $A^2$ each represent a divalent aromatic group which may have a substituent.

In a case where $A^2$ is a divalent thienothiazole group, it is preferable that at least one of $A^1$ or $A^2$ is a divalent aromatic hydrocarbon group which may have a substituent, and it is more preferable that both $A^1$ and $A^2$ are divalent aromatic hydrocarbon groups which may have a substituent.

In Formula (1), the "substituent" represented by each of $L^1$ and $L^2$ will be described.

As the above-mentioned substituent, a group introduced to enhance solubility and nematic liquid crystallinity, a group having an electron-donating property and an electron-withdrawing property introduced to adjust the color tone of a coloring agent, or a group having a crosslinkable group (polymerizable group) to be introduced to fix alignment is preferable.

Examples of the substituent include an alkyl group, an alkenyl group, an alkynyl group, an aryl group, a substituted or unsubstituted amino group, an alkoxy group, an oxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a sulfinyl group, a ureide group, a phosphoric acid amide group, a hydroxy group, a mercapto group, a halogen atom, a cyano group, a nitro group, a hydroxamic acid group, a sulfino group, a hydrazino group, an imino group, an azo group, a heterocyclic group, and a silyl group.

The alkyl group is preferably an alkyl group having 1 to 20 carbon atoms, more preferably an alkyl group having 1 to 12 carbon atoms, and particularly preferably an alkyl group having 1 to 8 carbon atoms, and examples thereof include a methyl group, an ethyl group, an isopropyl group, a tert-butyl group, an n-octyl group, an n-decyl group, an n-hexadecyl group, a cyclopropyl group, a cyclopentyl group, and a cyclohexyl group.

The alkenyl group is preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an awl group, a 2-butenyl group, and a 3-pentenyl group.

The alkynyl group is preferably an alkynyl group having 2 to 20 carbon atoms, more preferably an alkynyl group having 2 to 12 carbon atoms, and particularly preferably an alkynyl group having 2 to 8 carbon atoms, and examples thereof include a propargyl group and a 3-pentynyl group.

The aryl group is preferably an aryl group having 6 to 30 carbon atoms, more preferably an aryl group having 6 to 20 carbon atoms, and particularly preferably an awl group having 6 to 12 carbon atoms, and examples thereof include a phenyl group, a 2,6-diethylphenyl group, 3,5-ditrifluoromethylphenyl group, a styryl group, a naphthyl group, and a biphenyl group.

The substituted or unsubstituted amino group is preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group.

The alkoxy group is preferably an alkoxy group having 1 to 20 carbon atoms, and more preferably an alkoxy group having 1 to 15 carbon atoms, and examples thereof include a methoxy group, an ethoxy group, and a butoxy group.

The oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group.

The acyloxy group is preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group.

The acylamino group is preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group.

The alkoxycarbonylamino group is preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group.

The aryloxycarbonylamino group is preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof a phenyloxycarbonylamino group.

The sulfonylamino group is preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group.

The sulfamoyl group is preferably a sulfamoyl group having 0 to 20 carbon atoms, more preferably sulfamoyl group having 0 to 10 carbon atoms, and particularly preferably sulfamoyl group having 0 to 6 carbon atoms, and examples thereof include a sulfamoyl group, a methylsulfamoyl group, a dimethylsulfamoyl group, and a phenylsulfamoyl group.

The carbamoyl group is preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group.

The alkylthio group is preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group.

The arylthio group is preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group.

The sulfonyl group is preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group.

The sulfinyl group is preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group.

The ureide group is preferably a ureide group having 1 to 20 carbon atoms, more preferably a ureide group having 1 to 10 carbon atoms, and particularly preferably a ureide group having 1 to 6 carbon atoms, and examples thereof include an unsubstituted ureide group, a methyl ureide group, and a phenyl ureide group.

The phosphoric acid amide group is preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethyl phosphoric acid amide group and a phenyl phosphoric acid amide group.

Examples of the halogen atom include a fluorine atom, a chlorine atom, a bromine atom, and an iodine atom.

The heterocyclic group is preferably a heterocyclic group having 1 to 30 carbon atoms, and more preferably a heterocyclic group having 1 to 12 carbon atoms, and examples thereof include a heterocyclic group having a heteroatom such as a nitrogen atom, an oxygen atom, and a sulfur atom, such as an epoxy group, an oxetanyl group, an Imidazolyl group, a pyridyl group, a quinolyl group, a furyl group, a piperidyl group, a morpholino group, a benzoxazolyl group, a benzimidazolyl group, and a benzthiazolyl group.

Further, the silyl group is preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group.

These substituents may also be substituted with these substituents. In addition, in a case where two or more of the substituents are included, the substituents may be the same as or different from each other. Further, in a case where possible, the substituents may be bonded to each other to form a ring.

The substituent represented by each of $L^1$ and $L^2$ is preferably an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxy group, a cyano group, an imino group, an azo group, a halogen atom, or a heterocyclic group. The substituent is more preferably the alkyl group which may have a substituent, the alkenyl group which may have a substituent, the aryl group which may have a substituent, the alkoxy group which may have a substituent, the oxycarbonyl group which may have a substituent, the acyloxy group which may have a substituent, the amino group which may have a substituent, the nitro group, the imino group, or the azo group.

It is preferable that at least one of $L^1$ or $L^2$ includes a crosslinkable group (polymerizable group), and it is more preferable that both of $L^1$ and $L^2$ include the crosslinkable group.

Specific examples of the crosslinkable group include polymerizable groups described in paragraphs [0040] to [0050] of JP2010-244038A, and from the viewpoints of reactivity and synthesis suitability, an acryloyl group, a methacryloyl group, an epoxy group, an oxetanyl group, and a styryl group are preferable, and the acryloyl group and the methacryloyl group are preferable.

Suitable aspects of $L^1$ and $L^2$ include an alkyl group substituted with the above-mentioned crosslinkable group, a dialkylamino group substituted with the above-mentioned crosslinkable group, and an alkoxy group substituted with the above-mentioned crosslinkable group.

In the present invention, for a reason that an alignment degree of a specific dichroic coloring agent compound included in the polarizer layer 12 is further improved, it is preferable that the specific dichroic coloring agent compound has a structure represented by Formula (2).

(2)

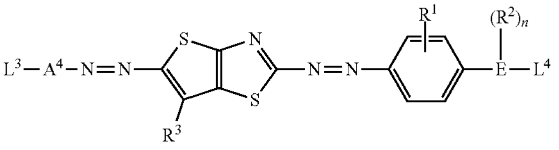

Here, in Formula (2), $A^4$ represents a divalent aromatic group which may have a substituent.

Furthermore, in Formula (2), $L^3$ and $L^4$ each independently represent a substituent.

Moreover, in Formula (2), E represents any one of a nitrogen atom, an oxygen atom, or a sulfur atom.

In addition, in Formula (2), $R^1$ represents any group or atom of a hydrogen atom, a halogen atom, an alkyl group which may have a substituent, and an alkoxy group which may have a substituent.

Furthermore, in Formula (2), $R^2$ represents a hydrogen atom or an alkyl group which may have a substituent.

Moreover, in Formula (2), $R^3$ represents a hydrogen atom or a substituent.

In addition, in Formula (2), n represents 0 or 1. It should be noted that in a case where E is the nitrogen atom, n is 1, and in a case where E is an oxygen atom or a sulfur atom, n is 0.

In Formula (2), specific examples and suitable aspects of the "divalent aromatic group which may have a substituent" represented by $A^4$ include the same ones as those of the "divalent aromatic group which may have a substituent" represented by each of $A^1$ to $A^3$ in Formula (1).

A particularly preferred aspect of $A^4$ is a phenylene group.

Specific examples and suitable aspects of the "substituent" represented by each of $L^3$ and $L^4$ in Formula (2) include the same ones as those of the "substituent" represented by each of $L^1$ and $L^2$ in Formula (1).

A more suitable aspect of each of $L^3$ and $L^4$ is that at least one of $L^3$ or $L^4$ includes a crosslinkable group, and a still more suitable aspect is that both $L^3$ and $L^4$ include a crosslinkable group. As a result, the alignment degree of the specific dichroic coloring agent compound included in the polarizer layer 12 is further improved, and the high-temperature durability and the moisture-heat resistance of the laminate are improved.

In addition, a more suitable aspect of the crosslinkable group of each of $L^3$ and $L^4$ is an acryloyl group or a methacryloyl group.

In Formula (2), E represents any one of a nitrogen atom, an oxygen atom, or a sulfur atom, and from the viewpoint of synthesis suitability, E is preferably the nitrogen atom.

In addition, from the viewpoint that it is easier to make the specific dichroic coloring agent compound have absorption on a short wavelength side, it is preferable that E in Formula (1) mentioned above is an oxygen atom. The specific dichroic coloring agent compound having absorption on the short wavelength side is, for example, a specific dichroic coloring agent compound having a maximum absorption wavelength in the vicinity of 500 to 530 nm.

On the other hand, from the viewpoint that it is easier to make the specific dichroic coloring agent compound have absorption on a long wavelength side, it is preferable that E in Formula (1) mentioned above is a nitrogen atom. The specific dichroic coloring agent compound having absorption on the long wavelength side is, for example, a specific dichroic coloring agent compound having a maximum absorption wavelength in the vicinity of 600 nm.

In Formula (2), $R^1$ represents any group or atom of a hydrogen atom, a halogen atom, an alkyl group which may have a substituent, and an alkoxy group which may have a substituent, and is preferably the hydrogen atom or the alkyl group which may have a substituent.

Next, the "alkyl group which may have a substituent" and the "alkoxy group which may have a substituent" represented by $R^1$ will be described.

Examples of the substituent include a halogen atom.

Examples of the alkyl group include a linear, branched, or cyclic alkyl group having 1 to 8 carbon atoms. Among those, a linear alkyl group having 1 to 6 carbon atoms is preferable, a linear alkyl group having 1 to 3 carbon atoms is more preferable, and a methyl group or an ethyl group is still more preferable.

Examples of the alkoxy group include an alkoxy group having 1 to 8 carbon atoms. Among those, an alkoxy group having 1 to 6 carbon atoms is preferable, an alkoxy group having 1 to 3 carbon atoms is more preferable, and a methoxy group or an ethoxy group is still more preferable.

In Formula (2), $R^2$ represents a hydrogen atom or an alkyl group which may have a substituent, and is preferably an alkyl group which may have a substituent.

Specific examples and suitable aspects of the "alkyl group which may have a substituent" represented by $R^2$ include the same ones as those of the above-mentioned "alkyl group which may have a substituent" in $R^1$ of Formula (2), and thus, a description thereof will be omitted.

In addition, in a case where E is the nitrogen atom, $R^2$ is a group which is present in Formula (2) (that is, it means a case where n=1). On the other hand, in a case where E is an oxygen atom or a sulfur atom, $R^2$ is a group which is not present in Formula (2) (that is, it means a case where n=0).

In Formula (2), $R^3$ represents a hydrogen atom or a substituent.

Specific examples and suitable aspects of the "substituent" represented by $R^3$ include the same ones as those of the above-mentioned "divalent aromatic group which may have a substituent", preferred aspects thereof are also the same, and thus, a description thereof will be omitted.

In Formula (2), n represents 0 or 1. It should be noted that in a case where E is the nitrogen atom, n is 1, and in a case where E is an oxygen atom or a sulfur atom, n is 0.

Specific examples of the specific dichroic coloring agent compound represented by Formula (1) include the compounds described in paragraphs [0051] to [0081] of JP2010-152351A, the contents of which is incorporated herein by reference.

Among those, suitable examples of the specific dichroic coloring agent compound having the structure represented by Formula (2) also include compounds (D-54) to (D-58) shown below, in addition to the compounds (D-1) to (D-53) described in paragraphs [0074] to of JP2010-152351A.

(D-53)

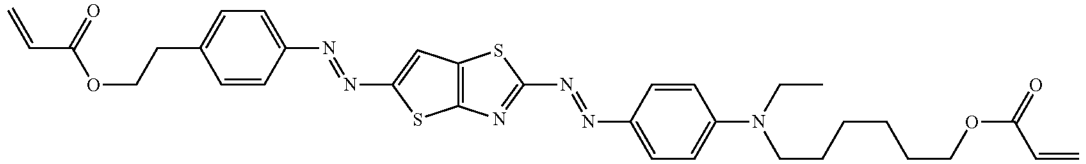

(D-54)

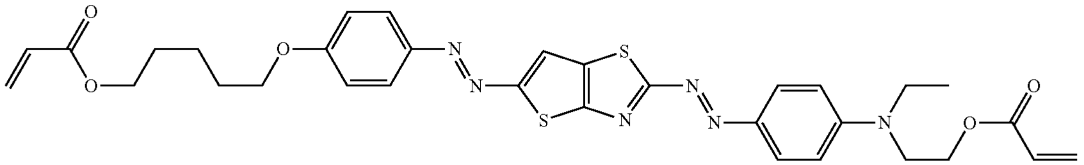

(D-55)

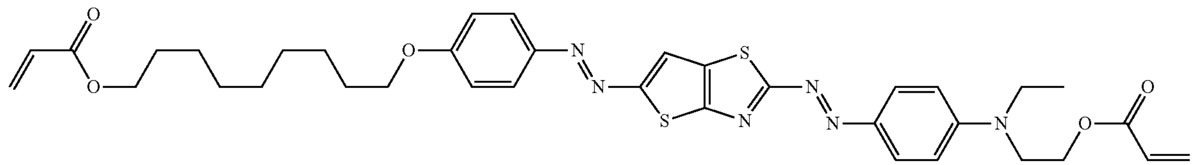

-continued (D-56)

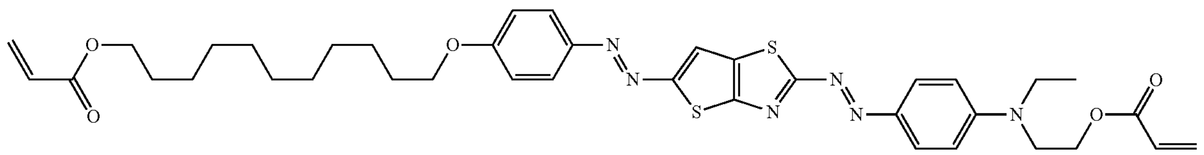

(D-57)

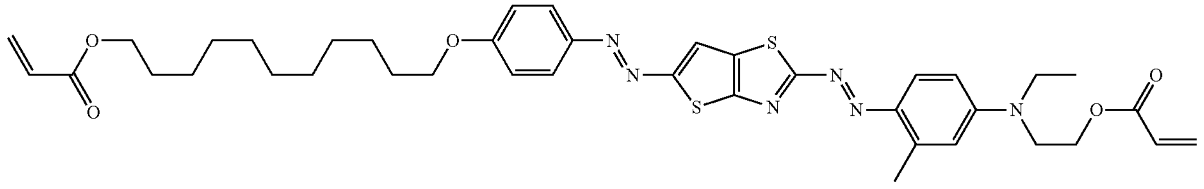

(D-58)

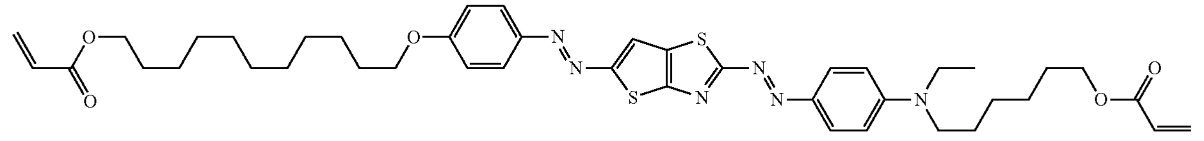

In the present invention, for a reason that the dichroic coloring agent compound can be aligned with a higher alignment degree while suppressing the precipitation of the dichroic coloring agent compound, it is preferable that the polarizer layer 12 is a film formed using a coloring composition which contains a liquid crystalline compound together with the above-mentioned dichroic coloring agent compound.

<Liquid Crystalline Compound>

As the liquid crystalline compound contained in the coloring composition, both of a low-molecular-weight liquid crystalline compound and a high-molecular-weight liquid crystalline compound can be used.

Here, the "low-molecular-weight liquid crystalline compound" refers to a liquid crystalline compound having no repeating unit in the chemical structure.

In addition, the "high-molecular-weight liquid crystalline compound" refers to a liquid crystalline compound having a repeating unit in the chemical structure.

Examples of the low-molecular-weight liquid crystalline compound include those described in JP2013-228706A.

Examples of the high-molecular-weight liquid crystalline compound include the thermotropic liquid crystalline polymers described in JP2011-237513A. In addition, the high-molecular-weight liquid crystalline compound may have a crosslinkable group (for example, an acryloyl group and a methacryloyl group) at the terminal.

<Interface Modifier>

The coloring composition preferably includes an interface modifier. By incorporation of the interface modifier, the smoothness of the coating surface is improved, and the improvement of the alignment degree and the improvement of the in-plane uniformity through suppression of cissing and unevenness are anticipated.

As the interface modifier, the compounds (horizontal alignment agents) described in paragraphs [0253] to [0293] of JP2011-237513A can be used.

In a case where the coloring composition contains an interface modifier, a content of the interface modifier is preferably 0.001 to 5 parts by mass, and more preferably 0.01 to 3 parts by mass with respect to 100 parts by mass of a total amount of the dichroic coloring agent compound and the liquid crystalline compound in the coloring composition.

<Polymerization Initiator>

The coloring composition may contain a polymerization initiator.

The polymerization initiator is not particularly limited, but is preferably a photosensitive compound, that is, a photopolymerization initiator.

As the photopolymerization initiator, various kinds of compounds can be used with no particular limitation. Examples of the photopolymerization initiator include an α-carbonyl compound, an acyloin ether, an α-hydrocarbon substituted aromatic acyloin compound, a polynuclear quinone compound, a combination of a triarylimidazole dimer and a p-aminophenyl ketone, acridine and phenazine compounds, an oxadiazole compound, and an acylphosphine oxide compound.

Examples of the α-carbonyl compound include those described in each specification of U.S. Pat. Nos. 2,367,661A and 2,367,670A. Examples of the acyloin ether include those described in the specification of U.S. Pat. No. 2,448,828A. Examples of the α-hydrocarbon substituted aromatic acyloin compound include those described in the specification of U.S. Pat. No. 2,722,512A. Examples of the polynuclear quinone compound include those described in each specification of U.S. Pat. Nos. 3,046,127A and 2,951,758A. Examples of the combination of the triarylimidazole dimer and the p-aminophenyl ketone are those described in the specification of U.S. Pat. No. 3,549,367A. Examples of the acridine and phenazine compounds include those described in JP1985-105667A (JP-H60-105667A) and the specification of U.S. Pat. No. 4,239,850A. Examples of the oxadiazole compound include those described in the specification of U.S. Pat. No. 4,212,970A. Further, examples of the acylphosphine oxide compound include those described in JP1988-040799B (JP-S63-040799B), JP1993-029234B (JP-H05-

029234B), JP1998-095788A (JP-H10-095788A), and JP1998-029997A (JP-H10-029997A).

A commercially available product can also be used as such a photopolymerization initiator, and examples thereof include IRGACURE 184, IRGACURE 907, IRGACURE 369, IRGACURE 651, IRGACURE 819, and IRGACURE OXE-01, all manufactured by BASF.

In a case where the coloring composition that forms the polarizer layer 12 contains a polymerization initiator, a content of the polymerization initiator is preferably 0.01 to 30 parts by mass, and more preferably 0.1 to 15 parts by mass with respect to 100 parts by mass of a total amount of the above-mentioned dichroic coloring agent compound and liquid crystalline compound in the coloring composition. In a case where the content of the polymerization initiator is 0.01 parts by mass or more, the curing properties of the polarizer layer 12 is better, whereas in a case where the content is 30 parts by mass or less, the alignment of the polarizer layer 12 is better.

<Solvent>

The coloring composition of the embodiment of the present invention preferably contains a solvent from the viewpoint of workability and the like.

Examples of the solvent include organic solvents such as ketones, ethers, aliphatic hydrocarbons, alicyclic hydrocarbons, aromatic hydrocarbons, halogenated carbons, esters, alcohols, cellosolves, cellosolve acetates, sulfoxides, amides, and heterocyclic compounds, as well as water. These solvents may be used alone or in combination of two or more kinds thereof.

Examples of the ketones include acetone, 2-butanone, methyl isobutyl ketone, cyclopentanone, and cyclohexanone. Examples of the ethers include dioxane and tetrahydrofuran. Examples of the aliphatic hydrocarbons include hexane. Examples of the alicyclic hydrocarbons include cyclohexane. Examples of the aromatic hydrocarbons include benzene, toluene, xylene, and trimethylbenzene. Examples of the halogenated carbons include dichloromethane, trichloromethane, dichloroethane, dichlorobenzene, and chlorotoluene. Examples of the esters include methyl acetate, ethyl acetate, and butyl acetate. Examples of the alcohols include ethanol, isopropanol, butanol, and cyclohexanol. Examples of the cellosolves include methyl cellosolve, ethyl cellosolve, and 1,2-dimethoxyethane. Examples of the sulfoxides include dimethyl sulfoxide. Examples of the amides include dimethylformamide and dimethylacetamide. Examples of the heterocyclic compound include pyridine.

Among these solvents, the organic solvents are preferably used, and the halogenated carbons or the ketones are more preferably used.

In a case where the coloring composition contains a solvent, the content of the solvent is preferably 80% to 99% by mass, more preferably 83% to 97% by mass, and still more preferably 85% to 95% by mass with respect to the total mass of the coloring composition.

<Other Components>

The coloring composition may further contain a dichroic coloring agent compound other than the above-mentioned specific dichroic coloring agent compound, or may contain a plurality of the above-mentioned specific dichroic coloring agent compounds. In a case where the coloring composition contains the plurality of dichroic coloring agent compounds, from the viewpoint of further curing the coloring composition, it is preferable that the coloring composition contains a dichroic coloring agent compound having a crosslinking group that crosslinks with the above-mentioned specific dichroic coloring agent compound, and it is more preferable that the coloring composition contains the plurality of the above-mentioned specific dichroic coloring agent compounds.

The thickness of the polarizer layer 12 is not limited, and a thickness at which the required polarization characteristics can be obtained may be appropriately set according to a forming material and the like. Here, in a case where the polarizer layer 12 is too thick, cracks easily occur in a case where the through-holes 16 are formed.

Therefore, the thickness of the polarizer layer 12 is preferably 0.1 to 5 μm, and more preferably 0.3 to 1.5 μm. The thickness of the polarizer layer 12 is a thickness at the position excluding the through-hole parts.

[Alignment Film]

The alignment film 14 is a film for aligning the compound in the polarizer layer 12. For example, in a case where the polarizer layer 12 contains a liquid crystal compound, the alignment film 14 aligns the liquid crystal compound in a case of forming the polarizer layer 12. As the alignment film, an organic alignment film is preferable.

Examples of a method of forming the alignment film include methods such as a rubbing treatment of an organic compound (preferably a polymer) on a film surface, oblique deposition of an inorganic compound, formation of a layer having microgrooves, and accumulation of an organic compound according to a Langmuir-Blodgett method (LB film). Examples of the organic compound accumulated by the Langmuir-Blodgett method include ω-tricosanoic acid, dioctadecylmethylammonium chloride, and methyl stearylate. Further, an alignment film in which an alignment function is generated by application of an electric field, application of a magnetic field, or light irradiation is also known.

Among those, in the present invention, from the viewpoint of easy control of a pretilt angle of the alignment film, an alignment film formed by a rubbing treatment is preferably exemplified, and for example, from the viewpoint of uniformity of alignment, a photo-alignment film formed by light irradiation is also preferably exemplified.

<<Rubbing-Treated Alignment Film>>

A polymer material used for an alignment film formed by the rubbing treatment is described in many documents, and many commercially available products thereof can be used.

In the present invention, polyvinyl alcohol, polyimide, a derivative thereof, and the like are preferably exemplified. With regard to the alignment film, reference can be made to the descriptions on page 43, line 24 to page 49, line 8 of WO2001/088574A.

<<Photo-Alignment Film>>

A photo-alignment compound used for an alignment film formed by light irradiation is described in many documents.

In the present invention, preferred examples of the photo-alignment compound include the azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, or JP4151746B, the aromatic ester compounds described in JP2002-229039A, the maleimide and/or alkenyl-substituted nadimide compounds having a photo-alignment unit described in JP2002-265541A or JP2002-317013A, the photo-crosslinkable silane derivatives described in JP4205195B or JP4205198B, and the photo-crosslinkable polyimides, polyamides, or esters described in JP2003-520878A, JP2004-529220A, or JP4162850B. More preferred examples of the photo-alignment material include an azo compound, a photo-crosslinkable polyimide, a polyamide, and an ester.

Among those, as the photo-alignment compound, a photosensitive compound having a photoreactive group in which at least one of dimerization or isomerization is caused by the action of light is preferably used.

In addition, the photoreactive group preferably has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

A thickness of the alignment film is preferably 0.01 to 10 μm, and more preferably 0.01 to 1 μm.

<<Method for Forming Photo-Alignment Film>>

The photo-alignment film formed from the above-mentioned material is irradiated with linearly polarized light or non-polarized light to produce a photo-alignment film.

In the present specification, "irradiation with linearly polarized light" and "irradiation with non-polarized light" are each an operation for causing a photoreaction to occur in a photo-alignment material. The wavelength of the light used varies depending on the photo-alignment material used, and is not particularly limited as long as it is necessary for the photoreaction. The peak wavelength of light used for light irradiation is preferably 200 to 700 nm, and ultraviolet rays having a peak wavelength of light of 400 nm or less are more preferable.

A light source used for light irradiation may be a commonly used light source, for example, a lamp such as a tungsten lamp, a halogen lamp, a xenon lamp, a xenon flash lamp, a mercury lamp, a mercury xenon lamp, and a carbon arc lamp, various lasers, a light emitting diode, and a cathode ray tube. Examples of the laser include a semiconductor laser, a helium neon laser, an argon ion laser, a helium cadmium laser, and a yttrium aluminum garnet (YAG) laser.

As a unit with which the linearly polarized light is obtained, a method using a polarizing plate, a method using a reflective polarizer with a prism system element or a Brewster angle, or a method using light emitted from a laser light source having polarized light can be adopted. Examples of the polarizing plate include an iodine polarizing plate, a dichroic coloring agent polarizing plate, a wire grid polarizing plate, and the like. Examples of the prism system element include a Gran Thomson prism.

In addition, only light at a required wavelength may also be selectively irradiated using a filter, a wavelength conversion element, or the like.

Examples of the method for irradiating light include, in the case of linearly polarized light, a method of irradiating light from the upper surface or the back surface of the alignment film, orthogonally or diagonally with respect to the surface of the alignment film. An incidence angle of light varies depending on the photo-alignment material, but is preferably 0° to 90° (orthogonal), and more preferably 40° to 90°.

In a case of non-polarized light, the alignment film is irradiated with non-polarized light obliquely. The incidence angle is preferably 10° to 80°, more preferably 20° to 60°, and still more preferably 30° to 50°.

The irradiation time is preferably 1 minute to 60 minutes, and more preferably 1 minute to 10 minutes.

[Support]

As the support 18, various transparent sheet-like objects (films, plate-like objects) having sufficient light transparency can be used.

Examples of a material that forms the support 18 include polycarbonate-based polymers; polyester-based polymers such as polyethylene terephthalate (PET) and polyethylene naphthalate; acrylic polymers such as polymethyl methacrylate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as a nylon and an aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers, vinyl butyral-based polymers; arylate-based polymers; polyoxymethylene-based polymers; and epoxy-based polymers.

As a material that forms the support 18, a thermoplastic norbornene-based resin can be preferably used. Examples of the thermoplastic norbornene-based resin include ZEONEX and ZEONOR, both manufactured by Zeon Corporation, and ARTON manufactured by JSR Corporation.

In addition, as the material that forms the support 18, a cellulosic polymer typified by triacetyl cellulose (TAC) can also be preferably used.

In the present invention, a thickness of the support 18 is not limited, and may be appropriately set according to the material that forms the support 18.

The thickness of the support 18 is preferably 100 μm or less, more preferably 80 μm or less, and still more preferably 10 to 80 μm.

[Pressure-Sensitive Adhesive Layer]

As the pressure-sensitive adhesive layer, a polarizing plate, a protective film, and a λ/4 plate can be bonded to each other, and various pressure-sensitive adhesives can be used as long as transparency can be ensured.

Examples of the pressure-sensitive adhesive included in the pressure-sensitive adhesive layer include a rubber-based pressure-sensitive adhesive, an acryl-based pressure-sensitive adhesive, a silicone-based pressure-sensitive adhesive, a urethane-based pressure-sensitive adhesive, a vinylalkyl ether-based pressure-sensitive adhesive, a polyvinyl alcohol-based pressure-sensitive adhesive, a polyvinylpyrrolidone-based pressure-sensitive adhesive, a polyacrylamide-based pressure-sensitive adhesive, and a cellulose-based pressure-sensitive adhesive.

Among those, the acryl-based pressure-sensitive adhesive (adhesive that is sensitive to pressure) is preferable from the viewpoints of transparency, weather fastness, heat resistance, and the like.

The pressure-sensitive adhesive layer can be formed, for example, by a method in which a solution of the pressure-sensitive adhesive is applied onto a release sheet and dried, and then the resultant is transferred to a surface of each layer; a method in which a solution of the pressure-sensitive adhesive is directly applied onto a surface of each layer and dried; or the like.

For example, the solution of the pressure-sensitive adhesive is prepared as a solution of about 10% to 40% by mass in which the pressure-sensitive adhesive is dissolved or dispersed in a solvent such as toluene or ethyl acetate.

Examples of the applying method include a roll coating method such as reverse coating and gravure coating, a spin coating method, a screen coating method, a fountain coating method, a dipping method, and a spray method.

In addition, examples of a constituent material of the release sheet include appropriate thin leaf-like materials, for example, a film of a synthetic resin such as polyethylene, polypropylene, and polyethylene terephthalate; a rubber sheet; paper; a fabric; a non-woven fabric; a net; a foam sheet; and a metal foil.

In the present invention, a thickness of the pressure-sensitive adhesive layer is not limited, and the thickness at which the required adhesive force can be obtained may be appropriately set according to the type of the pressure-sensitive adhesive, and the like.

The thickness of the pressure-sensitive adhesive layer is preferably 3 to 50 μm, more preferably 4 to 40 μm, and still more preferably 5 to 30 μm.

[Protective Film]

The polarizing plate 10 may have a protective film on a surface of the polarizer layer 12.

It is preferable that a protective film is provided on the surface of the polarizer layer 12 from the viewpoint that the polarizer layer 12 can be protected from moisture and the like.

As the protective film, various known sheet-like objects used as a protective film for an optical film can be used. As an example, a film (resin film) consisting of various resin materials exemplified by the above-mentioned support is suitably exemplified.

[λ/4 Plate]

The "λ/4 plate" is a plate having a λ/4 function, specifically, a plate having a function of converting linearly polarized light at a certain specific wavelength into circularly polarized light, or converting circularly polarized light into linearly polarized light.

The λ/4 plate 26 is not limited, and various known plates having a λ/4 function can be used. Specific examples of the λ/4 plate 26 include those described in US2015/0277006A.

Specific examples of an aspect in which the λ/4 plate 26 has a monolayer structure include a stretched polymer film, and a phase difference film which has an optically anisotropic layer having a λ/4 provided function on a support. In addition, specific examples of an aspect in which the λ/4 plate has a multi-layer structure include a broadband λ/4 plate formed by laminating a λ/4 plate and a λ/2 wavelength plate.

A thickness of the λ/4 plate 26 is not particularly limited, but a thinner one is preferable.

By reducing the thickness of the λ/4 plate 26, the element substrate 104 and a polarizing plate 10 (polarizer layer 12) can be brought close to each other, and thus, an expected angle from the light emitting element 106 to the through-hole 16 of the polarizer layer 12 can be increased to increase the utilization efficiency of light emitted by the light emitting element.

The thickness of the λ/4 plate 26 is preferably 1 to 5 μm, more preferably 1 to 4 μm, and still more preferably 1 to 3 μm.

[Display Element]

The display element 102 is a known display element having an EL light emitting element, which is used in an inorganic EL display device, an organic EL display device, and the like.

The display element may be one corresponding to the display of a multicolor (full-color) image, or may be one corresponding to the display of a single-color (monochromatic) image.

For example, in a case where the display element corresponds to the display of a multicolor (full-color) image, it has an R light emitting element that emits red light, a G light emitting element that emits green light, and a B light emitting element that emits blue light. In a similar manner to known display elements, the display element has a number of such R light emitting elements, G light emitting elements, and B light emitting elements arranged two-dimensionally.

In addition, for example, in a case where the display element corresponds to the display of a single-color (monochromatic) image, a configuration in which the display element has only the R light emitting element, has only the G light emitting element, or has only the B light emitting element is adopted. Alternatively, the display element may be one corresponding to a display of a two-color image, or the like, which has the R light emitting element and the G light emitting element, has the R light emitting element and the B light emitting element, or has the G light emitting element and the B light emitting element.

In the present invention, an area ratio of the light emitting element 106 in the display element 102 is not limited. The area ratio of the light emitting element in the display element 102 is preferably 30% or less, more preferably 10% or less, still more preferably 3% or less, and even still more preferably 1% or less.

As described above, in the present invention, the position of the through-hole 16 of the polarizing plate 10 and the position of the light emitting element 106 of the display element 102 are set to correspond to each other. Therefore, by setting the area ratio of the light emitting element 106 in the display element 102 to 30% or less, the area of a region contributing to the antireflection for external light can be widened, and thus, more suitably, a sufficient utilization efficiency of light emitted by the light emitting element 106 can be ensured and the antireflection effect for external light can be improved.

The external light reflection in the present invention is determined by the external light reflectance, and an area ratio thereof at each position in a screen in a case of being visually recognized from a general visible distance according to the display device. That is, the screen resolution of the display device 100 does not contribute to the suppression of the reflection of external light. On the other hand, the screen resolution of the display device 100 is preferably high from the viewpoint of providing a display device having excellent display quality.

In order to reduce the area ratio of the light emitting element 106 in the display element 102, it is necessary to increase an output of the light emitting element in order to obtain a sufficient brightness. From this viewpoint, it is preferable that the light emitting element 106 in the display element 102 is an inorganic EL light emitting element (so-called LED). By using the inorganic EL light emitting element, a sufficient brightness is obtained even in a case where the area ratio of the light emitting element is set to a range of preferably 30% or less, more preferably 10% or less, still more preferably 3% or less, and even still more preferably 1% or less.

In order to obtain the display device 100 that realizes a high resolution and a sufficient brightness while reducing the area ratio of the light emitting element, it is preferable to use a fine inorganic EL light emitting element. As the fine inorganic EL light emitting element, an inorganic EL light emitting element having a diameter of a circle inscribed with the inorganic EL light emitting element of 360 μm or less is preferable, an inorganic EL light emitting element having a diameter of a circle inscribed with the inorganic EL light emitting element of 200 μm or less is more preferable, an inorganic EL light emitting element having a diameter of a circle inscribed with the inorganic EL light emitting element of 100 μm or less is still more preferable, and an inorganic EL light emitting element having a diameter of a circle inscribed with the inorganic EL light emitting element of 50 μM or less is even still more preferable.

<Light Emitting Element>

In the present invention, it is possible to use various known light emitting elements used in a self-luminous display device using an inorganic EL light emitting element, an organic EL light emitting element, or the like as the light emitting element 106.

Therefore, the light emitting element may be one in which an R light emitting element, a G light emitting element, and a B light emitting element are arranged by an organic light emitting diode (OLED) in a display element. Alternatively, the light emitting element may be one in which an R light emitting elements, a G light emitting element, and a B light emitting element are arranged by an inorganic EL n a display element. The inorganic EL is a so-called light emitting diode (LED). Further, the display element may be a display element in which light emitting units having an R light emitting element, a G light emitting element, and a B light emitting element, which are fine inorganic EL light emitting elements, are arranged two-dimensionally.

<Element Substrate>

As the element substrate 104, various element substrates used as an element substrate in organic EL display devices in the related art, inorganic EL display devices, and the like, such as a resin film and a glass substrate, can be used.

Furthermore, in the present invention, a commercially available self-luminous display device (display) using an inorganic EL light emitting element, an organic EL light emitting element, or the like may be used as the display element 102 as long as it does not have a circularly polarizing plate having a polarizing plate (polarizer) and a λ/4 plate as an antireflection layer. In addition, the commercially available display device may have a touch panel or the like.

[Method for Producing Polarizing Plate]

A first embodiment of the method for producing a polarizing plate of the embodiment of the present invention is a method for producing a polarizing plate having a plurality of through-holes that penetrate an alignment film and a polarizer layer, the method including:

an alignment film forming step of forming an alignment film having a plurality of through-parts on a transfer support, a polarizer layer forming step of forming a layer consisting of a composition to be a polarizer layer on the alignment film and the transfer support in the through-parts, and a peeling step of peeling the transfer support and the layer consisting of the composition to be the polarizer layer on the transfer support.

Hereinafter, the first embodiment of the method for producing a polarizing plate will be described with reference to FIGS. 7 to 10.

[Alignment Film Forming Step]

Figure 7:
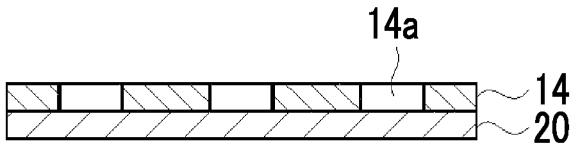
FIG. 7 is a conceptual view for explaining a method for producing a polarizing plate of an embodiment of the present invention.
Figure 8:
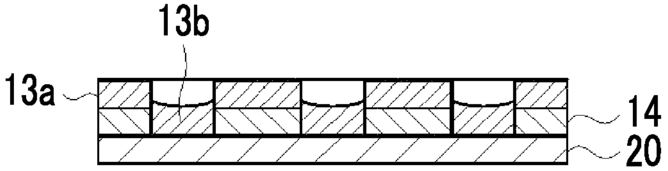
FIG. 8 is a conceptual view for explaining the method for producing a polarizing plate of the embodiment of the present invention.

As shown in FIG. 7, the alignment film forming step is a step of forming an alignment film 14 (hereinafter also referred to as a patterned alignment film) having a plurality of through-parts **14*a* on a transfer support 20. The through-parts 14*a* correspond to the through-holes 16 of the polarizing plate 10 to be manufactured. Therefore, the shape, the size, arrangement position (arrangement pattern), the number density, and the like of the through-parts 14*a* are appropriately set according to the shape, the size, the arrangement position (arrangement pattern), the number density, and the like of the through-holes 16 of the produced polarizing plate 10**.

The method for forming a patterned alignment film is not particularly limited. As an example thereof, a method in which a coating liquid containing a material to be the above-mentioned photo-alignment film is applied onto the transfer support 20 by printing such as offset printing and gravure printing to form a coating layer having predetermined through-parts **14*a*** formed in a patterned manner, and the coating layer is irradiated with linearly polarized light or non-polarized light to form an alignment film can be cited.

As the transfer support, a film (resin film) consisting of various resin materials exemplified in the above-mentioned support is suitably exemplified.

[Polarizer Layer Forming Step]

The polarizer layer forming step is a step of forming a patterned alignment film 14 on the transfer support 20, and then forming a polarizer layer on the alignment film 14 and the transfer support 20 in the through-parts **14*a***.

As an example thereof, the polarizer layer forming step has a composition applying step, an aligning step, and a curing step.

<Composition Applying Step>

Specifically, first, a composition applying step of applying a composition (hereinafter also referred to as a coloring composition) to be a polarizer layer 12 on the alignment film 14 is carried out. At that time, since the alignment film 14 has the through-parts **14*a*, the applied coloring composition enters the through-parts 14*a* at the positions of the through-parts 14*a*, and the composition layer is thus formed on the transfer support 20. Since the coloring composition applied directly on the transfer support 20 soaks into the transfer support 20, the adhesiveness between the formed polarizer layer and the transfer support 20** is high.

Specific examples of a method for applying the coloring composition include known methods such as a roll coating method, a gravure printing method, a spin coating method, a wire bar coating method, an extrusion coating method, a direct gravure coating method, a reverse gravure coating method, a die coating method, a spray method, and an inkjet method.

In addition, the coloring composition may contain a solvent, in addition to the materials for a polarizer layer such as the dichroic coloring agent compound and the liquid crystalline compound as mentioned above. Alternatively, a coloring composition which has been made into a liquid material such as a molten liquid by heating or the like may be used. As a result, it is easier to apply the coloring composition on the alignment film 14.

<Aligning Step>

Next, an aligning step for aligning the liquid crystalline compound included in the composition layer is carried out. Furthermore, the liquid crystalline compound is a component including not only the above-mentioned liquid crystalline compound but also a liquid crystalline dichroic coloring agent compound in a case where the above-mentioned dichroic coloring agent compound has liquid crystallinity.

The aligning step preferably has a heating treatment. By performing the heating treatment, the liquid crystalline compound included in the composition layer can be aligned in an alignment state according to the alignment restriction force of the alignment film 14.

Here, as described above, the alignment film 14 has the through-parts 14*a*. Therefore, the liquid crystal compound in the composition layer (corresponding to a reference numeral 13*a* in FIG. 8) existing on the alignment film 14 is aligned by the alignment film 14. On the other hand, the liquid crystal compound in the through-part 14*a*, that is, the composition layer (corresponding to the reference numeral 13*b* in FIG. 8) existing on the transfer support 20, is aligned since it is not easily affected by the alignment restriction force of the alignment film 14.

The temperature and the time of the heating treatment are not limited, and the treatment temperature and the treatment time at which the liquid crystalline compound can be suitably aligned may be appropriately set according to the liquid crystalline compound and the dichroic coloring agent contained in the composition layer. The temperature of the heating treatment is preferably performed at 10° C. to 250° C., and more preferably performed at 25° C. to 190° C. from the viewpoint of manufacturing suitability and the like. In addition, the heating time is preferably 1 to 300 seconds, and more preferably 1 to 60 seconds.

The aligning step may have a drying treatment. By the drying treatment, components such as a solvent can be removed from the coating film. The drying treatment may be performed by a method of leaving the coating film at room temperature for a predetermined time (for example, natural drying), or may be performed by heating and/or blowing.

Here, the liquid crystalline compound included in the coloring composition may be aligned by the above-mentioned composition applying step or the drying treatment. At this time, for example, in an aspect in which the coloring composition is prepared as a composition including a solvent, a polarizer layer can be obtained by drying the composition layer and removing the solvent from the composition layer.

In a case where the drying treatment is performed at a temperature equal to or higher than the transition temperature of the liquid crystalline compound included in the composition layer into a liquid crystal phase, the heating treatment may not be carried out.

The transition temperature of the liquid crystalline compound included in the composition layer to the liquid crystal phase is preferably 10° C. to 250° C., and more preferably 25° C. to 190° C., from the viewpoint of manufacturing suitability and the like. In a case where the transition temperature is 10° C. or higher, a cooling treatment or the like for lowering the temperature to a temperature range in which a liquid crystal phase is exhibited is not required, which is thus preferable. In addition, in a case where the transition temperature is 250° C. or lower, a high temperature is not required even in a case where the liquid crystal phase is once brought into an isotropic liquid state at a higher temperature than the temperature range in which a liquid crystal phase is exhibited, which is thus preferable since waste of thermal energy, and deformation, deterioration, or the like of a support can be reduced.

The aligning step may have a cooling treatment which is carried out after the heating treatment. The cooling treatment is a treatment for cooling the heated composition layer to approximately room temperature (approximately 20° C. to 25° C.). As a result, the alignment of the liquid crystalline compound included in the composition layer can be fixed.

The method for the cooling treatment is not limited and various known methods for cooling a sheet-like material can be used.

<Curing Step>

The polarizer layer forming step may have a curing step of curing the polarizer layer (layer consisting of a composition to be a polarizer layer, the layer being hereinafter also simply referred to as a polarizer layer) after the above-mentioned aligning step.

For example, in a case where the polarizer layer has a crosslinkable group (polymerizable group), the curing step is carried out by heating and/or light irradiation (exposure). Above all, the curing step is preferably performed by light irradiation.

Various light sources such as infrared light, visible light, and ultraviolet rays can be used as a light source for curing, but the ultraviolet rays are preferable. In addition, the ultraviolet rays may be irradiated while heating at the time of curing or the ultraviolet rays may be irradiated through a filter which transmits only a specific wavelength.

In a case where irradiation with ultraviolet rays or the like is performed while heating, the heating temperature is not limited, and may be appropriately set according to the transition temperature of the liquid crystalline compound included in the polarizer layer (coloring composition) into the liquid crystal phase, and the like. The heating temperature is preferably 25° C. to 140° C.

In addition, the light irradiation in the curing step may be performed in a nitrogen atmosphere. In a case where curing of the polarizer layer proceeds by radical polymerization, it is preferable that light irradiation is performed in a nitrogen atmosphere since the inhibition of polymerization by oxygen is reduced.

[Peeling Step]

The peeling step is a step of peeling the transfer support 20 and the polarizer layer 13*b* on the transfer support 20. Here, as described above, since the coloring composition applied directly onto the transfer support 20 soaks into the transfer support 20, the adhesiveness between the formed polarizer layer 13*b* and the transfer support 20 is high. Therefore, in a case where the transfer support 20 is peeled from the alignment film 14, the polarizer layer 13*b* on the transfer support 20 is also removed from the laminate of the alignment film 14 and the polarizer layer 13*a* following the transfer support 20. As a result, the through-holes 16 in the alignment film 14 and the polarizer layer 12 are formed, and a polarizing plate 10 having a plurality of the through-holes 16 that penetrate the alignment film 14 and the polarizer layer 12 is manufactured.

The peeling method in the peeling step is not particularly limited as long as the transfer support 20 and the polarizer layer 13*b* on the transfer support 20 can be suitably peeled from the alignment film 14 and the polarizer layer 12.

Figure 9:
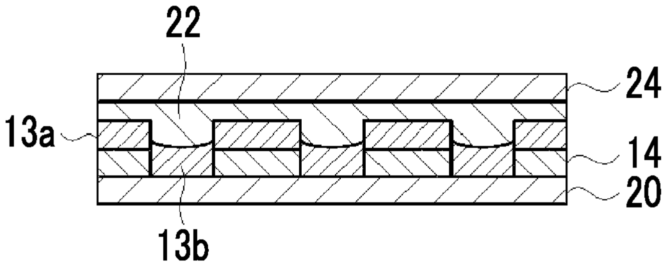
FIG. 9 is a conceptual view for explaining the method for producing a polarizing plate of the embodiment of the present invention.
Figure 10:
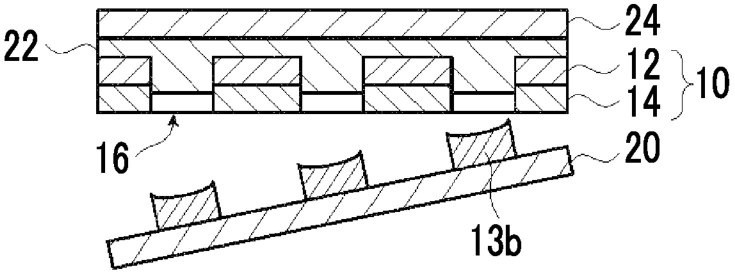
FIG. 10 is a conceptual view for explaining the method for producing a polarizing plate of the embodiment of the present invention.

As an example thereof, a method in which a pressure-sensitive adhesive layer 22 and a protective film 24 are laminated in this order on the polarizer layer 12 side as shown in FIG. 9, and then the transfer support 20 and the polarizer layer 13*b* on the transfer support 20 are peeled from the alignment film 14 as shown in FIG. 10 can be cited.

The pressure-sensitive adhesive layer 22 may be formed by applying a solution of a pressure-sensitive adhesive onto a surfaces on the side of the polarizer layers 13*a* and 13*b* after the polarizer layer forming step, or the solution of the pressure-sensitive adhesive may also be applied onto the protective film 24, and then affixed to surfaces on the side of the polarizer layers 13*a* and 13*b* of the laminate having the transfer support 20, the alignment film 14, and the polarizer layers 13*a* and 13*b*.

As a result, it is possible to prevent the thin alignment film 14 and polarizer layer 13*a* from being damaged by affixing the protective film (support) to the laminate, and peeling the transfer support 20 and the polarizer layer 13*b* from the alignment film 14.

In addition, in the example shown in FIG. 9, a configuration in which the protective film 24 and the pressure-sensitive adhesive layer 22 are laminated on the surfaces on the side of the polarizer layers 13*a* and 13*b* of the laminate having the transfer support 20, the alignment film 14, and the polarizer layers 13*a* and 13*b* is adopted, but the present invention is not limited thereto. For example, a configuration in which a resin layer is formed on the surfaces on the side of the polarizer layers 13*a* and 13*b*, and the transfer support 20 and the polarizer layer 13*b* are peeled from the alignment film 14 while the alignment film 14 and the polarizer layer 13*a* are held with the resin layer may be adopted.

A second embodiment of the method for producing a polarizing plate of the embodiment of the present invention is:

a method for producing a polarizing plate, including forming a plurality of through-holes by carrying out punching of a laminate having an alignment film and a polarizer layer.

The second embodiment of the method for producing a polarizing plate will be described with reference to FIG. 11.

Figure 11:
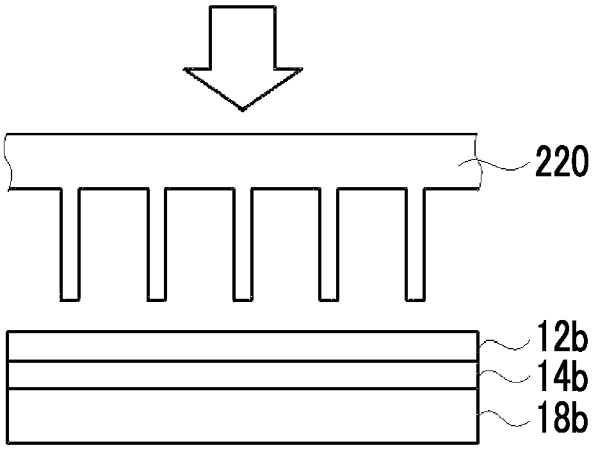
FIG. 11 is a conceptual view for explaining another embodiment of the method for producing a polarizing plate of the present invention.

As shown in FIG. 11, a laminate in which an alignment film 14*b* and a polarizer layer 12*b* are laminated on a support 18*b* is prepared. The alignment film 14*b* and the polarizer layer 12*b* are each a layer having no through-holes.

This laminate is punched out by a pressing mold 220 having a plurality of convex parts to form the through-holes 16. Therefore, a pressing mold 220 has a convex part of the size, the shape, and the arrangement pattern set according to the size, shape, arrangement pattern, and the like of the through-holes 16 to be formed.

As a result, a polarizing plate having the shape as shown in FIG. 3 can be manufactured.

Furthermore, in a method for producing a polarizing plate according to the second embodiment, the above-mentioned various supports can be used as the support 18*b*.

Moreover, the alignment film 14*b* can be formed by various methods such as the above-mentioned rubbing treatment.

In addition, the polarizer layer 12*b* can be formed by the same method as the method described in the first embodiment, except that the polarizer layer 12*b* is formed on the alignment film 14*b* having no through-part.

Here, in the above-mentioned example, the polarizing plate having a polarizer layer in which the dichroic coloring agent is horizontally aligned has been described, but the present invention is not limited thereto and the polarizing plate may be a polarizing plate having a light absorption anisotropic layer (polarizer layer) in which a dichroic coloring agent (liquid crystal compound) is vertically aligned. That is, the polarizing plate of the embodiment of the present invention may have a configuration in which the polarizing plate has a light absorption anisotropic layer (polarizer layer) in which the dichroic coloring agent is vertically aligned, and an alignment film, and has through-holes that penetrate the light absorption anisotropic layer (polarizer layer) and the alignment film.

Therefore, in the present invention, the alignment film is a layer that excites the alignment of the dichroic coloring agent (or the liquid crystal compound).

A polarizing plate having a light absorption anisotropic layer (polarizer layer) in which such a dichroic coloring agent is vertically aligned, and having a plurality of through-holes can be used in a display device so as to absorb light emitted from the LED in the lateral direction while maintaining the brightness of the LED, and suppress the light leakage. As a result, a contrast of the display device can be increased.

Examples of the alignment film that vertically aligns the dichroic coloring agent include a layer having hydrophilicity (hydrophilic layer). In a case where the hydrophilic layer is used as the alignment film and a vertical alignment agent is added to a composition to be a polarizer layer, there occurs an effect that the hydrophilic layer attracts the vertical alignment agent by a hydrophilicity-hydrophobicity interaction, making it possible to vertically align the dichroic coloring agent (or the liquid crystal compound).

Examples of the hydrophilic layer include a polyvinyl alcohol and a polyacrylate.

Examples of the vertical alignment agent include boronic acid, carboxylic acid, and polypropylene oxide.

The polarizing plate having a light absorption anisotropic layer (polarizer layer) in which such a dichroic coloring agent is vertically aligned can be manufactured by the same method as the production methods of the above-mentioned first embodiment and second embodiment, except that the alignment film is used as the hydrophilic layer.

Hereinbefore, the polarizing plate, the circularly polarizing plate, and the method for producing a polarizing plate of the embodiments of the present invention have been described in detail, but the present invention is not limited to the above-described examples, and various improvements or modifications may be made within a range not departing from the scope of the present invention.

EXAMPLES

Hereinafter, the present invention will be described in more detail with reference to Examples. Furthermore, in the following examples, materials, amounts thereof used, ratios thereof, the details of treatments, treatment procedures, and the like can be suitably modified without departing from the scope of the present invention. Therefore, the scope of the present invention should not be restrictively interpreted by the following Examples.

Example 1

[Manufacture of Cellulose Acylate Film 1]

A cellulose acylate film 1 was manufactured as follows.

(Manufacture of Core Layer Cellulose Acylate Dope)

The following composition was introduced into a mixing tank and stirred to dissolve the respective components, thereby preparing a cellulose acetate solution used as a core layer cellulose acylate dope.

| Core layer cellulose acylate dope | |
|---|---|
| Cellulose acetate having acetyl substitution degree of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

Compound F

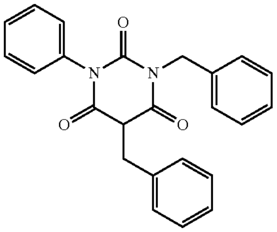 [SMILES: O=C1C(Cc2ccccc2)C(=O)N(c2ccccc2)C(=O)N1Cc1ccccc1]

(Manufacture of Outer Layer Cellulose Acylate Dope)

To 90 parts by mass of the core layer cellulose acylate dope was added 10 parts by mass of the following matting agent solution to prepare a cellulose acetate solution used as an outer layer cellulose acylate dope.

| Matting agent solution | |
|---|---|
| Silica particles having average particle size of 20 nm (AEROSIL R972, manufactured by NIPPON AEROSIL CO., LTD.) | 2 parts by mass |
| Methylene chloride (first solvent) | 76 parts by mass |
| Methanol (second solvent) | 11 parts by mass |
| The core layer cellulose acylate dope | 1 part by mass |

(Manufacture of Cellulose Acylate Film 1)

The core layer cellulose acylate dope and the outer layer cellulose acylate dope were filtered with filter paper having an average pore diameter of 34 μm and a sintered metal filter having an average pore diameter of 10 μm, and then three layers of the core layer cellulose acylate dope and the outer layer cellulose acylate dopes on both sides thereof were cast onto a drum at 20° C. from casting ports at the same time (band casting machine).

Subsequently, the film was peeled in the state where the solvent content reached approximately 20% by mass, the both ends of the film in the width direction were fixed with tenter clips, and the film was dried while being stretched at a stretching ratio of 1.1 times in the cross direction.

Thereafter, the film was transported between rolls in a heating treatment device and further dried to produce an optical film having a thickness of 40 μm, which was used as a cellulose acylate film 1. The in-plane retardation of the obtained cellulose acylate film 1 was 0 nm.

(Formation of Alignment Film)

The following coating liquid PA1 for forming an alignment layer was continuously applied onto the cellulose acylate film 1 by a gravure printing method. At that time, the coating film was applied so as to have a shape having predetermined through-parts in a predetermined pattern. The opening shape of the through-part was a square shape in 600 μm×600 μm, the pitch between the through-parts was 5 mm, and the through-parts were formed at intervals of 5 mm in one predetermined direction and in a direction orthogonal to this one direction.

The support on which the coating film was formed was dried with hot air at 140° C. for 120 seconds, and subsequently, the coating film was irradiated with polarized ultraviolet rays (10 mJ/$cm^2$, using an ultra-high-pressure mercury lamp) to form an alignment layer PA1, whereby a TAC film with a photo-alignment layer was obtained.

The film thickness thereof was 0.3 μm.

| Coating liquid PA1 for forming alignment layer | |
|---|---|
| The following polymer PA-1 | 100.00 parts by mass |
| The following acid generator PAG-1 | 5.00 parts by mass |
| The following acid generator CPI-110TF | 0.005 parts by mass |

-continued

| Coating liquid PA1 for forming alignment layer | |
|---|---|
| Xylene | 1,220.00 parts by mass |
| Methyl isobutyl ketone | 122.00 parts by mass |

Polymer PA-1

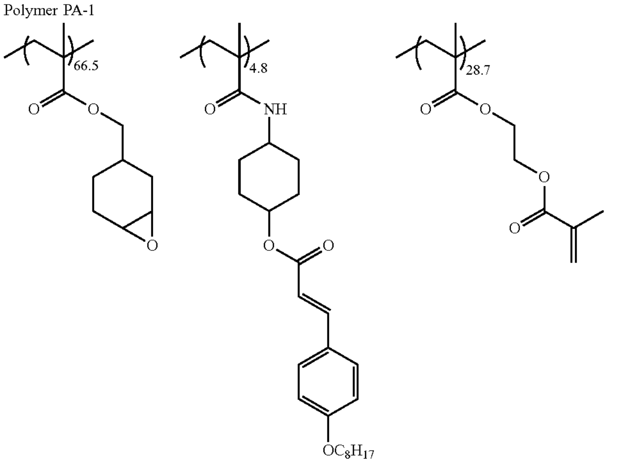

Acid generator PAG-1

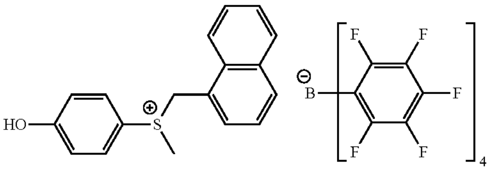

Acid generator CPI-110F

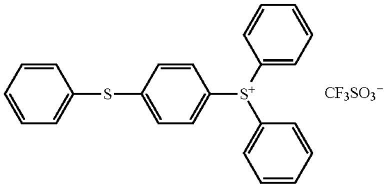

[Formation of Polarizer Layer]

The following composition CP1 for forming a polarizer layer was continuously applied onto the alignment layer PA1 with a wire bar to form a composition layer. Then, the composition layer was heated at 140° C. for 30 seconds and then cooled to room temperature (23° C.). Subsequently, the coating layer was heated at 90° C. for 60 seconds and cooled again to room temperature. Thereafter, the coating layer was irradiated with light for 2 seconds under an irradiation condition of an illuminance of 200 mW/cm$^2$, using a LED lamp (center wavelength of 365 nm), to manufacture a polarizer layer CP1 on the alignment layer PA1.

The film thickness thereof was 1.6 μm.

| Composition of composition CP1 for forming polarizer layer | |
|---|---|
| The following dichroic substance D-1 | 0.25 parts by mass |
| The following dichroic substance D-2 | 0.36 parts by mass |
| The following dichroic substance D-3 | 0.59 parts by mass |
| The following high-molecular-weight liquid crystalline compound P-1 | 3.57 parts by mass |
| Polymerization initiator IRGACURE OXE-02 (manufactured by BASF) | 0.200 parts by mass |
| The following surfactant F-1 | 0.026 parts by mass |
| Cyclopentanone | 46.00 parts by mass |
| Tetrahydrofuran | 46.00 parts by mass |
| Benzyl alcohol | 3.00 parts by mass |

D-1

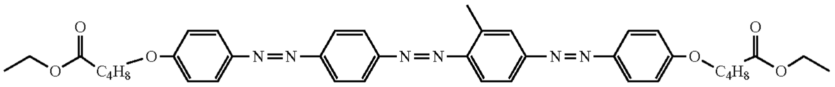

-continued

| Composition of composition CP1 for forming polarizer layer |
|---|
| D-2 |
| 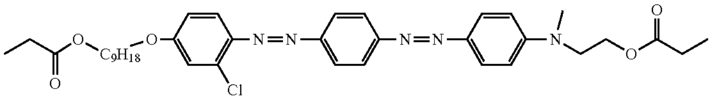 |
| D-3 |
| 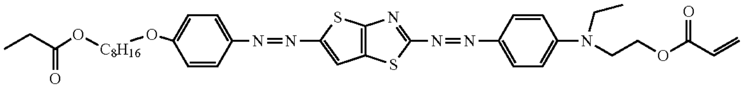 |
| P-1 |
| 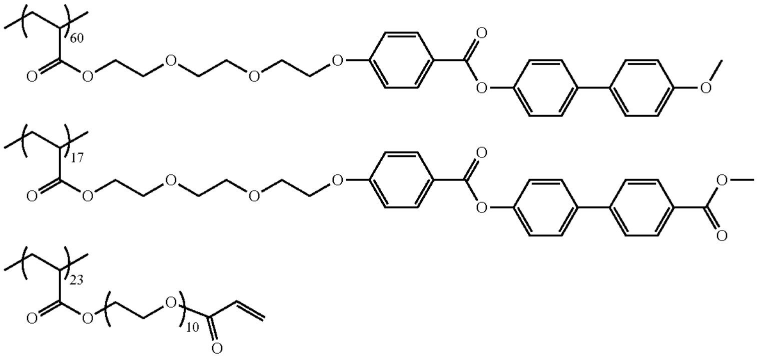 |
| F-1 |
| 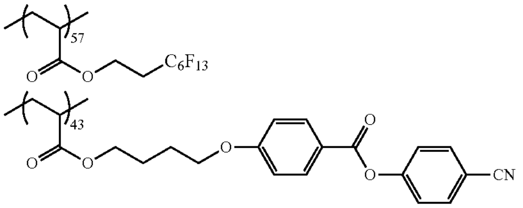 |

[Formation of Cured Layer IM1]

The following composition IM1 for forming a cured layer was continuously applied onto the formed polarizer layer CP1 with a wire bar to form a coating film. Subsequently, the coating film was dried at room temperature and then irradiated for 15 seconds using a high-pressure mercury lamp under an irradiation condition of an illuminance of 28 $mW/cm^2$ to form a cured layer IM1 on the polarizer layer CP1.

A film thickness of the cured layer IM1 was 0.05 μm (50 nm).

| Composition of composition IM1 for forming cured layer | |
|---|---|
| The following mixture L1 of rod-like liquid crystalline compounds | 2.61 parts by mass |
| The following modified trimethylol propane triacrylate | 0.11 parts by mass |
| The following photopolymerization initiator I-1 | 0.05 parts by mass |
| The following interface modifier F-3 | 0.21 parts by mass |
| Methyl isobutyl ketone | 297 parts by mass |

A mixture L1 of rod-like liquid crystalline compounds (the numerical values in the following formulae represent % by mass, and R represents a group bonded to an oxygen atom.)

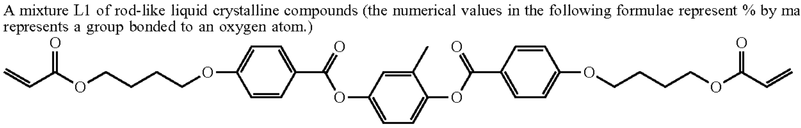
84%

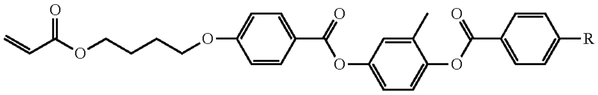
14%

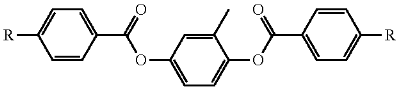
2%

R: 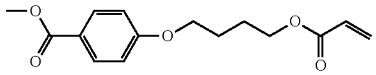

-continued

Composition of composition IM1 for forming cured layer

Modified trimethylol propane triacrylate

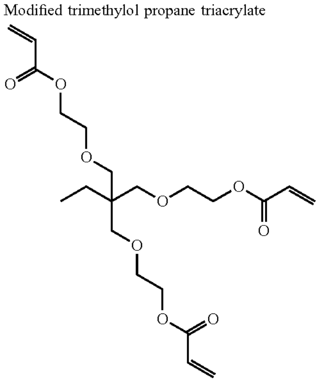

Photopolymerization Initiator I-1

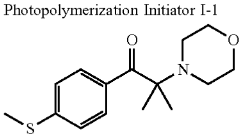

Interface modifier F-3

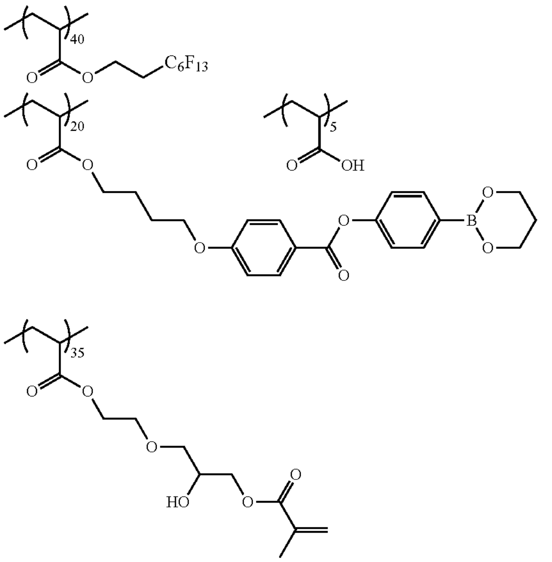

[Formation of Oxygen Shielding Layer (Gas Barrier Layer) BL1]

A coating liquid having the following composition (composition BL1 for forming an oxygen shielding layer) was continuously applied onto the formed cured layer IM1 with a wire bar. Thereafter, drying was performed with hot air at 100° C. for 2 minutes to form a polyvinyl alcohol (PVA) alignment layer (oxygen shielding layer BL1) with a thickness of 1.0 μm on the cured layer IM1. As a result, a laminate A1 was manufactured.

| Composition of composition BL1 for forming oxygen shielding layer | |
|---|---|
| The following modified polyvinyl alcohol | 3.80 parts by mass |
| Polymerization initiator IRGACURE 2959 (manufactured by BASF) | 0.20 parts by mass |
| Water | 70 parts by mass |
| Methanol | 30 parts by mass |

Modified polyvinyl alcohol

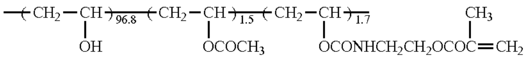

[Formation of Through-Holes (Peeling Step)]

The oxygen shielding layer side of the laminate A1 was affixed to the support side of a low-reflection surface film CV-LC5 (manufactured by FUJIFILM Corporation), using an Opteria D692 (thickness: 15 μm) pressure-sensitive adhesive manufactured by Lintec Corporation. Then, the support (cellulose acylate film 1) of the laminate A1 was peeled. As a result, a polarizer layer directly formed on the support (cellulose acylate film 1) was removed to form through-holes in the laminate A1. As described above, the laminate B1 including the polarizing plate of the embodiment of the present invention was manufactured.

[Manufacture of λ/4 Plate]

(Formation of Alignment Layer)

The following coating liquid PA2 for forming an alignment layer was continuously applied onto a cellulose acylate film 1 with a wire bar. The support on which the coating film was formed was dried with hot air at 140° C. for 120 seconds, and subsequently, the coating film was irradiated with polarized ultraviolet rays (10 mJ/cm$^2$, using an ultra-high-pressure mercury lamp) to form an alignment layer PA2 having a thickness of 0.2 μm, thereby obtaining a TAC film with an alignment layer.

| Coating liquid PA2 for forming alignment layer | |
|---|---|
| The following polymer PA-2 | 100.00 parts by mass |
| The acid generator PAG-1 | 5.00 parts by mass |
| The acid generator CPI-110TF | 0.005 parts by mass |
| Isopropyl alcohol | 16.50 parts by mass |

-continued

| Coating liquid PA2 for forming alignment layer | |
|---|---|
| Butyl acetate | 1,072.00 parts by mass |
| Methyl ethyl ketone | 268.00 parts by mass |

Polymer PA-2

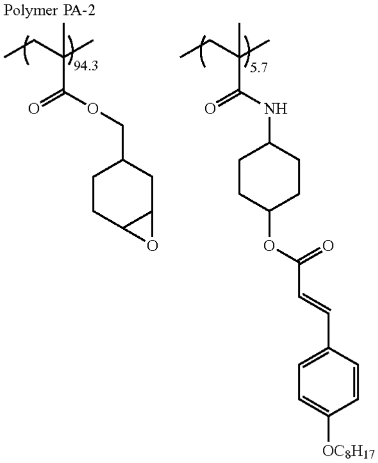

(Formation of Positive A-Plate Layer LC1)

A composition LC1 having the composition described below was applied onto the alignment layer PA2 using a bar coater. A coating film formed on the alignment layer PA2 was heated to 120° C. with hot air and then cooled to 60° C., and the alignment of the liquid crystalline compound was immobilized by irradiating the coating film with ultraviolet rays at 100 mJ/cm$^2$ at a wavelength of 365 nm using a high-pressure mercury lamp in a nitrogen atmosphere, and subsequently irradiating the coating film with ultraviolet rays at 500 mJ/cm$^2$ while heating to 120° C., thereby manufacturing a λ/4 plate C1 having a positive A-plate LC1 layer.

The thickness and the Re(550) of the positive A-plate LC1 layer were 2.5 μm an 144 nm, respectively. That is, the positive A-Plate LC1 layer acts as a λ/4 plate. In addition, the positive A-plate LC1 layer satisfied a relationship of Re(450)≤Re(550)≤Re(650). Re(450)/Re(550) was 0.82.

| Composition LC1 | |
|---|---|
| The following polymerizable liquid crystalline compound L-1 | 43.50 parts by mass |
| The following polymerizable liquid crystalline compound L-2 | 43.50 parts by mass |
| The following polymerizable liquid crystalline compound L-3 | 8.00 parts by mass |
| The following polymerizable liquid crystalline compound L-4 | 5.00 parts by mass |
| The following polymerization initiator PI-1 | 0.55 parts by mass |
| The following leveling agent T-1 | 0.20 parts by mass |
| Cyclopentanone | 235.00 parts by mass |

Polymerizable liquid crystalline compound L-1 (tBu represents a tertiary butyl group)

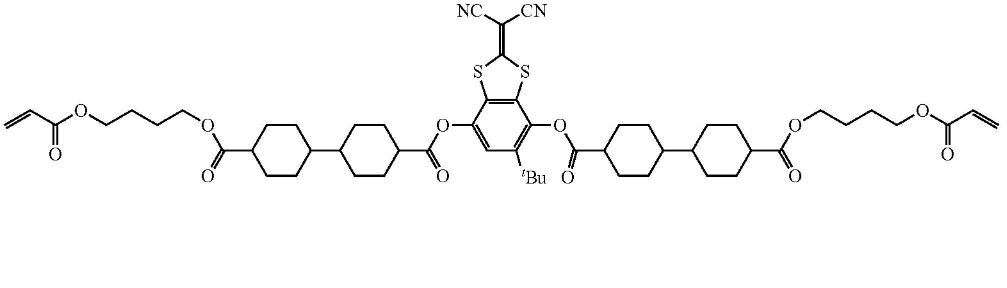 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

-continued

| Composition LC1 |
|---|
| Polymerizable liquid crystalline compound L-2 |
| 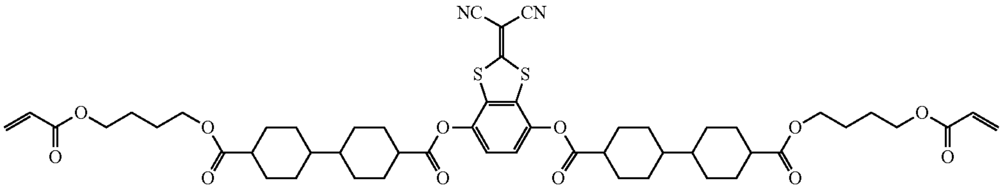 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1] |
| Polymerizable liquid crystalline compound L-3 |
| 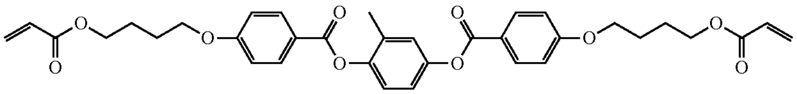 [SMILES: C=CC(=O)OCCCCOc1ccc(C(=O)Oc2ccc(OC(=O)c3ccc(OCCCCOC(=O)C=C)cc3)c(C)c2)cc1] |
| Polymerizable liquid crystalline compound L-4 (Me represents a methyl group) |
| 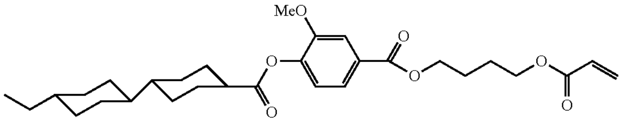 [SMILES: C=CC(=O)OCCCCOC(=O)c1ccc(OC(=O)C2CCC(C3CCC(CC)CC3)CC2)c(OC)c1] |
| Polymerization initiator PI-1 |
| 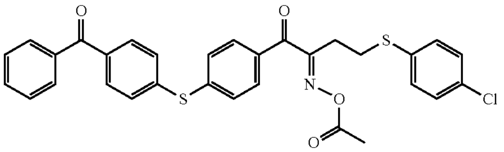 [SMILES: CC(=O)O/N=C(\CCSc1ccc(Cl)cc1)C(=O)c1ccc(Sc2ccc(C(=O)c3ccccc3)cc2)cc1] |
| Leveling agent T-1 |
| 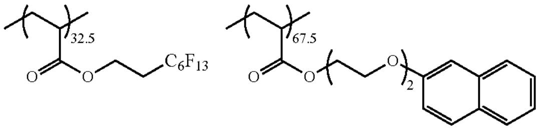 |

[Manufacture of Circularly Polarizing Plate D1]

An Opteria D692 (thickness: 15 μm) pressure-sensitive adhesive manufactured by Lintec Corporation was affixed to the alignment film side of the laminate B1 to affix the LC-1 layer side of the λ/4 plate C1 thereto. At this time, the affixing was performed so that an angle formed by the absorption axis of the light absorption anisotropic layer P1 and the slow axis of the λ/4 plate was 45°. Then, the support (cellulose acylate film 1) of the λ/4 plate C1 was peeled together with the alignment layer PA2 to manufacture a circularly polarizing plate D1.

[Manufacture of LED Display E1]

An LED (PICOLED manufactured by ROHM Co., Ltd.: 0.6 mm square size) was two-dimensionally arranged on a printed substrate having a reflectance of 40% so that the LED area ratio was 36%, and used as an LED display (display element) E1.

[Manufacture of Display Device]

An Opteria D692 (thickness: 15 μm) pressure-sensitive adhesive manufactured by Lintec Corporation was affixed to the LC-1 layer of the circularly polarizing plate D1 to affix the LED display E1 thereto. As a result, the display device was manufactured.

Example 2

A display device was manufactured in the same manner as in Example 1, except that the composition CP1 for forming a polarizer layer was changed to the following composition CP2 for forming a polarizer layer. A film thickness of CP2 was 5 μm.

| Composition of composition CP2 for forming polarizer layer | |
|---|---|
| The dichroic substance D-1 | 0.08 parts by mass |
| The dichroic substance D-2 | 0.12 parts by mass |
| The dichroic substance D-3 | 0.19 parts by mass |
| The high-molecular-weight liquid crystalline compound P-1 | 3.57 parts by mass |
| Polymerization initiator IRGACURE OXE-02 (manufactured by BASF) | 0.200 parts by mass |
| The surfactant F-1 | 0.026 parts by mass |
| Cyclopentanone | 46.00 parts by mass |
| Tetrahydrofuran | 46.00 parts by mass |
| Benzyl alcohol | 3.00 parts by mass |

Example 3

A display device was manufactured in the same manner as in Example 1, except that the composition CP1 for forming a polarizer layer was changed to the following composition CP3 for forming a polarizer layer. The film thickness of CP3 was 6 μm.

| Composition of composition CP3 for forming polarizer layer | |
|---|---|
| The dichroic substance D-1 | 0.07 parts by mass |
| The dichroic substance D-2 | 0.10 parts by mass |
| The dichroic substance D-3 | 0.15 parts by mass |
| The high-molecular-weight liquid crystalline compound P-1 | 3.57 parts by mass |

-continued

| Composition of composition CP3 for forming polarizer layer | |
|---|---|
| Polymerization initiator IRGACURE OXE-02 (manufactured by BASF) | 0.200 parts by mass |
| The surfactant F-1 | 0.026 parts by mass |
| Cyclopentanone | 46.00 parts by mass |
| Tetrahydrofuran | 46.00 parts by mass |
| Benzyl alcohol | 3.00 parts by mass |

Example 4

A display device was manufactured in the same manner as in Example 1, except that an Opteria D692 (thickness: 15 μm) pressure-sensitive adhesive manufactured by Lintec Corporation was affixed to the alignment film side of the laminate B1 of Example 1 to affix the LED display E1 thereto. That is, the display device was manufactured in the same manner as in Example 1, except that the λ/4 plate C1 was not provided.

Example 5

A laminate A1 was manufactured in the same manner as in Example 1, except that the alignment layer PA1 of Example 1 was manufactured using a bar coater. Through-holes were formed in the laminate A1 by punching so that the laminate A1 had the same pattern as the alignment film pattern of Example 1. Thereafter, a display device was manufactured in the same manner as in Example 1.

Example 6

A display device was manufactured in the same manner as in Example 1, except that the bar number of the composition CP1 for forming a polarizer layer of Example 1 was changed and the film thickness was set to 0.5 μm.

Comparative Example 1

The alignment layer PA1 was manufactured on the cellulose acylate film 1 in the same manner as in Example 5, using a bar coater. The following composition CP1 for forming a polarizer layer was continuously applied onto the alignment layer PA1 with a wire bar to form a coating layer CP1. Next, the coating layer CP1 was heated at 140° C. for 30 seconds, and the coating layer CP1 was cooled to room temperature (23° C.). Subsequently, the coating layer was heated at 90° C. for 60 seconds and cooled again to room temperature.

Thereafter, by irradiation for 2 seconds using an LED lamp (center wavelength: 365 nm) under an illuminance of 200 mW/cm$^2$ via a mask, a polarizer layer having a cured region and a non-cured region of a liquid crystalline compound in the plane were manufactured on the alignment layer PA1. A film thickness thereof was 1.6 μm. The pattern of the mask was the same as the pattern of the alignment film of Example 1.

A film having the polarizer layer was immersed in ethanol for 3 minutes, and the non-polymerized liquid crystal compound was removed by washing to form a patterned polarizing layer having regions having different transmittances and degrees of polarization in the plane.

Thereafter, a display device was manufactured in the same manner as in Example 1.

Comparative Example 2

A display device was manufactured in the same manner as in Comparative Example 1, except that the immersion in ethanol for 3 minutes in Comparative Example 1 was changed to immersion in ethanol for 24 hours.

[Evaluation]

The transmittance and the reflectance of the through-hole portion of the manufactured circularly polarizing plate D1 (the laminate B1 in Example 4), the transmittance of a region other than the through-holes, and the presence or absence of cracks after patterning were evaluated.

[Method for Measuring Transmittance and Degree of Polarization]

A light source, a sample (a polarizing plate before laminating a λ/4 plate), an analyzer (Luceo Co., Ltd., POLAX-25N), and a two-dimensional spectroradiometer (manufactured by Topcon Technohouse Corporation, SR-5000) were arranged in this order to face each other, thereby constructing a measurement system capable of detecting an intensity of light transmitted through the sample and the analyzer, among the lights emitted by the light source.

A size of the sample was set to 100 mm square. In addition, a distance between the two-dimensional spectroradiometer and the sample was set to 400 mm.

In the measurement, a transmitted light intensity 40) was measured every 15° by a rotary analyzer method. After the measurement, an MD transmittance and a TD transmittance of the sample were calculated, assuming that the MD transmittance and the TD transmittance of the analyzer were known. Thereafter, the degree of polarization and the single-body transmittance in the specific region (through-hole part and non-through-hole part) of the sample were calculated using Equations (1) and (2).

$$\text{Degree (\%) of polarization}=\{(MD-TD)/(MD+TD)\}^{1/2}\times 100 \qquad \text{Equation (1)}$$

$$\text{Single-body transmittance (\%)}=(MD+TD)/2 \qquad \text{Equation (2)}$$

[Evaluation of Reflectance]

Using a spectrocolorimeter (CM2022 manufactured by Konica Minolta), values of Y in an SCI measurement method were measured 10 times by changing the position in the plane, and an average value thereof was used as the reflectance. The measured reflectance was evaluated according to the following standard.

A: The reflectance is 10% or less.

B: The reflectance is more than 10% and 40% or less.

C: The reflectance is more than 40%.

[Evaluation of Cracks]

An end part of an opening of the circularly polarizing plate was observed using an optical microscope, and the number of cracks extending from the end part or the corner of the opening was counted. Twenty-five openings were observed and evaluated according to the number of cracks according to the following standard.

A: The number of cracks is less than 2.

B: The number of cracks is 2 or more and less than 10.

C: The number of cracks is 10 or more.

The results are shown in Table 1.

TABLE 1

| | Polarizer layer | | | | | | Evaluation | | | | |
|---|---|---|---|---|---|---|---|---|---|---|---|
| | | Through-hole | | | | | Through-hole part | Non-through-hole part | | | |
| | Film thickness µm | Opening shape | Number density number/in$^2$ | Opening ratio % | Patterning method | Presence or absence of λ/4 plate | Trans-mittance % | Reflec-tance % | Trans-mittance % | Degree of polarization % | Presence or absence of cracks |
| Example 1 | 1.6 | 600 µm square | 25 | 36 | Peeling of transfer support | Present | 92 | A | 42 | 99 | A |
| Example 2 | 5 | 600 µm square | 25 | 36 | Peeling of transfer support | Present | 92 | A | 42 | 99 | A |
| Example 3 | 6 | 600 µm square | 25 | 36 | Peeling of transfer support | Present | 92 | A | 42 | 99 | B |
| Example 4 | 1.6 | 600 µm square | 25 | 36 | Peeling of transfer support | Absent | 92 | B | 42 | 99 | A |
| Example 5 | 1.6 | 600 µm square | 25 | 36 | Punching | Present | 92 | A | 42 | 99 | A |
| Example 6 | 0.5 | 600 µm square | 25 | 36 | Peeling of transfer support | Present | 92 | B | 75 | 28 | A |
| Comparative Example 1 | 1.6 | 600 µm square | 25 | 36 | Removal of non-cured region by washing (3 minutes) | Present | 89 | A | 42 | 99 | A |
| Comparative Example 2 | 1.6 | 600 µm square | 25 | 36 | Removal of non-cured region by washing (24 hours) | Present | 92 | C | 75 | 10 | A |

From Table 1, since the polarizing plate of the embodiment of the present invention has through-holes, the light transmittance in the through-hole part is higher than that in Comparative Examples. Therefore, it can be seen that in a case where the polarizing plate is used in a display device, it is possible to suppress the absorption of light emitted by the light emitting element, and it is possible to increase the utilization efficiency of light.

Moreover, from the comparison of Examples 1 to 3, it can be seen that the film thickness of the polarizer layer is preferably 5 µm or less from the viewpoint of suppressing the generation of cracks.

In addition, from the comparison between Example 1 and Example 4, it can be seen that it is preferable to use the polarizing plate and the λ/4 plate in combination as a circularly polarizing plate from the viewpoint of anti-reflection.

Example 7

A polarizing plate having a light absorption anisotropic layer (polarizer layer) in which a coloring agent was aligned in the vertical direction was manufactured as follows.

The following coating liquid PA3 for forming an alignment layer was continuously applied onto the cellulose acylate film 1 by a gravure printing method. At that time, the coating film was applied so as to have a shape having predetermined through-parts in a predetermined pattern. The opening shape of the through-part was a square shape in 600 µm×600 µm, the pitch between the through-parts was 5 mm, and the through-parts were formed at intervals of 5 mm in one predetermined direction and in a direction orthogonal to this one direction. A support on which the coating film had been formed was dried with hot air at 60° C. for 60 seconds and further with hot air at 100° C. for 120 seconds to form an alignment layer, and a TAC film with the alignment layer was obtained.

A film thickness thereof was 1 µm.

| Coating liquid PA3 for forming alignment layer | |
|---|---|
| The following modified polyvinyl alcohol | 3.80 parts by mass |
| Initiator Irg2959 | 0.20 parts by mass |
| Water | 70 parts by mass |
| Methanol | 30 parts by mass |

Modified polyvinyl alcohol

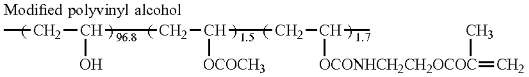

<Formation of Light Absorption Anisotropic Layer CP4>

The following composition CP4 for forming a light absorption anisotropic layer was continuously applied onto the obtained alignment layer PA3 with a wire bar to form a coating layer CP4.

Next, the coating layer CP4 was heated at 140° C. for 30 seconds, and the coating layer P1 was cooled to room temperature (23° C.).

Subsequently, the film was heated at 80° C. for 60 seconds and cooled again to room temperature.

Thereafter, the coating layer was irradiated with light for 2 seconds under an irradiation condition of an illuminance of 200 mW/cm$^2$, using a LED lamp (center wavelength of 365 nm), to manufacture a light absorption anisotropic layer CP4 on the alignment layer PA3.

A film thickness and an alignment degree of the coating layer CP4 were 3 μm and 0.96, respectively.

This was taken as a light absorption anisotropic film 1.

15: coating liquid for forming alignment film
16: through-hole
18, 18*b*: support
20: transfer support
22, 23: pressure-sensitive adhesive layer

| Composition of composition CP4 for forming light absorption anisotropic layer | |
|---|---|
| The dichroic substance D-1 | 0.40 parts by mass |
| The dichroic substance D-2 | 0.15 parts by mass |
| The dichroic substance D-3 | 0.63 parts by mass |
| The high-molecular-weight liquid crystalline compound P-1 | 3.65 parts by mass |
| Polymerization initiator IRGACURE OXE-02 (manufactured by BASF) | 0.040 parts by mass |
| The following compound E-1 | 0.060 parts by mass |
| The following compound E-2 | 0.060 parts by mass |
| The following surfactant F-4 | 0.010 parts by mass |
| The following surfactant F-5 | 0.015 parts by mass |
| Cyclopentanone | 47.00 parts by mass |
| Tetrahydrofuran | 47.00 parts by mass |
| Benzyl alcohol | 1.00 part by mass |

Compound E-1

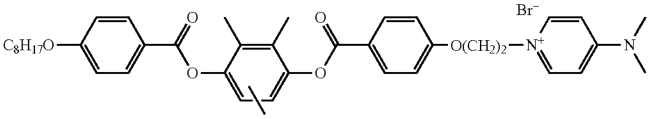

Compound E-2

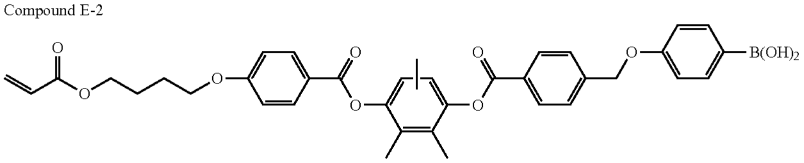

Surfactant F-4

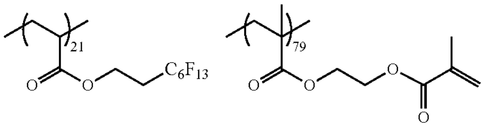

Surfactant F-5

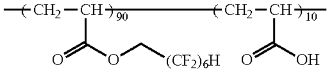

Further, the oxygen shielding layer (gas barrier layer) BL1 was formed on the light absorption anisotropic layer CP4 in the same manner as in Example 1 to manufacture a laminate 3.

The laminate 3 manufactured as described above was affixed to the LED display E1 to manufacture a display device.

It was confirmed that in a case where the manufactured display device was turned on, the polarizer layer (light absorption anisotropic layer) vertically aligned in a portion other than the opening suppresses the spread of the LED light while maintaining the brightness of the LED, and a display image having a high contrast was obtained.

From the above results, the effect of the present invention is apparent.

The polarizing plate can be suitably used for various display devices.

EXPLANATION OF REFERENCES

10: polarizing plate
12, 12*b*, 13*a*, 13*b*: polarizer layer
14, 14*b*: alignment film
14*a*: through-part
24: protective film
25: circularly polarizing plate
26: λ/4 plate
100: display device
102: display element
104: element substrate
106: light emitting element
220: pressing mold

What is claimed is:

1. A polarizing plate comprising:

an alignment film; and a polarizer layer including a dichroic coloring agent, wherein the polarizing plate has a plurality of through-holes that penetrate the alignment film and the polarizer layer, the polarizer layer is formed using a composition which contains a liquid crystalline compound and the dichroic coloring agent, the alignment film aligns the liquid crystalline compound, the polarizing plate is used for a display element having a self-luminous type light emitting elements, in a case where the polarizing plate is disposed on the display element, the plurality of through-holes are respectively disposed at positions corresponding to the light emitting elements, the polarizing plate further comprises a protective film laminated on the polarizer layer side via an adhesive layer, the adhesive layer is filled in at least a part of the through-holes, and an average diameter of the through-holes is 10 μm to 100 μm.

2. The polarizing plate according to claim 1, wherein a number density of the through-holes is 3 to 2,500/$in^2$.

3. The polarizing plate according to claim 1, wherein the dichroic coloring agent is water-insoluble.

4. A circularly polarizing plate comprising:

the polarizing plate according to claim 1; and a λ/4 plate.

5. The polarizing plate according to claim 1, wherein a distance between the light emitting elements and the polarizer layer is 80% or less of a pitch of the light emitting elements.

6. The polarizing plate according to claim 1, wherein a film thickness of the polarizer layer is 5 μm or less.

7. The polarizing plate according to claim 6, wherein an opening ratio of the through-holes, which is a ratio of a total opening area of the plurality of through-holes to an area of a main surface of the polarizing plate, is 50% or less.

8. The polarizing plate according to claim 6, wherein a number density of the through-holes is 3 to 2,500/$in^2$.

9. The polarizing plate according to claim 6, wherein the dichroic coloring agent is water-insoluble.

10. A circularly polarizing plate comprising:

the polarizing plate according to claim 6; and a λ/4 plate.

11. The polarizing plate according to claim 1, wherein an opening ratio of the through-holes, which is a ratio of a total opening area of the plurality of through-holes to an area of a main surface of the polarizing plate, is 50% or less.

12. The polarizing plate according to claim 11, wherein a number density of the through-holes is 3 to 2,500/$in^2$.

13. The polarizing plate according to claim 11, wherein the dichroic coloring agent is water-insoluble.

14. A circularly polarizing plate comprising:

the polarizing plate according to claim 11; and a λ/4 plate.

* * * * *